(12) United States Patent
Matsunami

(10) Patent No.: US 8,767,460 B2
(45) Date of Patent: Jul. 1, 2014

(54) NONVOLATILE SEMICONDUCTOR MEMORY DEVICE

(75) Inventor: Junya Matsunami, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 133 days.

(21) Appl. No.: 13/417,494

(22) Filed: Mar. 12, 2012

(65) Prior Publication Data

US 2013/0028028 A1  Jan. 31, 2013

(30) Foreign Application Priority Data

Jul. 27, 2011  (JP) ................................. 2011-164479

(51) Int. Cl.
*G11C 8/00* (2006.01)

(52) U.S. Cl.
USPC .................................................... 365/185.03

(58) Field of Classification Search
USPC ........................................ 365/185.27, 185.03
See application file for complete search history.

(56) References Cited

U.S. PATENT DOCUMENTS

| | | | | |
|---|---|---|---|---|
| 2006/0171235 A1* | 8/2006 | Takeuchi | .................. | 365/230.03 |
| 2009/0109745 A1* | 4/2009 | Aritome | .................... | 365/185.03 |
| 2010/0110792 A1 | 5/2010 | Lutze et al. | | |
| 2010/0135078 A1* | 6/2010 | Iwai et al. | ................. | 365/185.03 |
| 2012/0025293 A1* | 2/2012 | Sakamoto et al. | ............ | 257/316 |
| 2012/0171859 A1* | 7/2012 | Ponoth et al. | .................. | 438/620 |

FOREIGN PATENT DOCUMENTS

JP    2009-188204    8/2009

* cited by examiner

*Primary Examiner* — Hoai V Ho
*Assistant Examiner* — Min Huang
(74) *Attorney, Agent, or Firm* — Oblon, Spivak, McClelland, Maier & Neustadt, L.L.P.

(57) ABSTRACT

A plurality of element isolation insulating films are formed in a semiconductor substrate in a memory cell array and have a first direction as a long direction. A plurality of element formation regions are formed isolated by the element isolation insulating films. A memory string is formed in each of the element formation regions. A plurality of element formation region groups are each configured by the element formation regions. In a memory cell array, in a second direction orthogonal to the first direction, a spacing between the element formation region groups is configured larger than a spacing between the element formation regions in each of the element formation region groups. A control circuit executes a write operation on the memory cell array on an element formation region group basis.

19 Claims, 24 Drawing Sheets

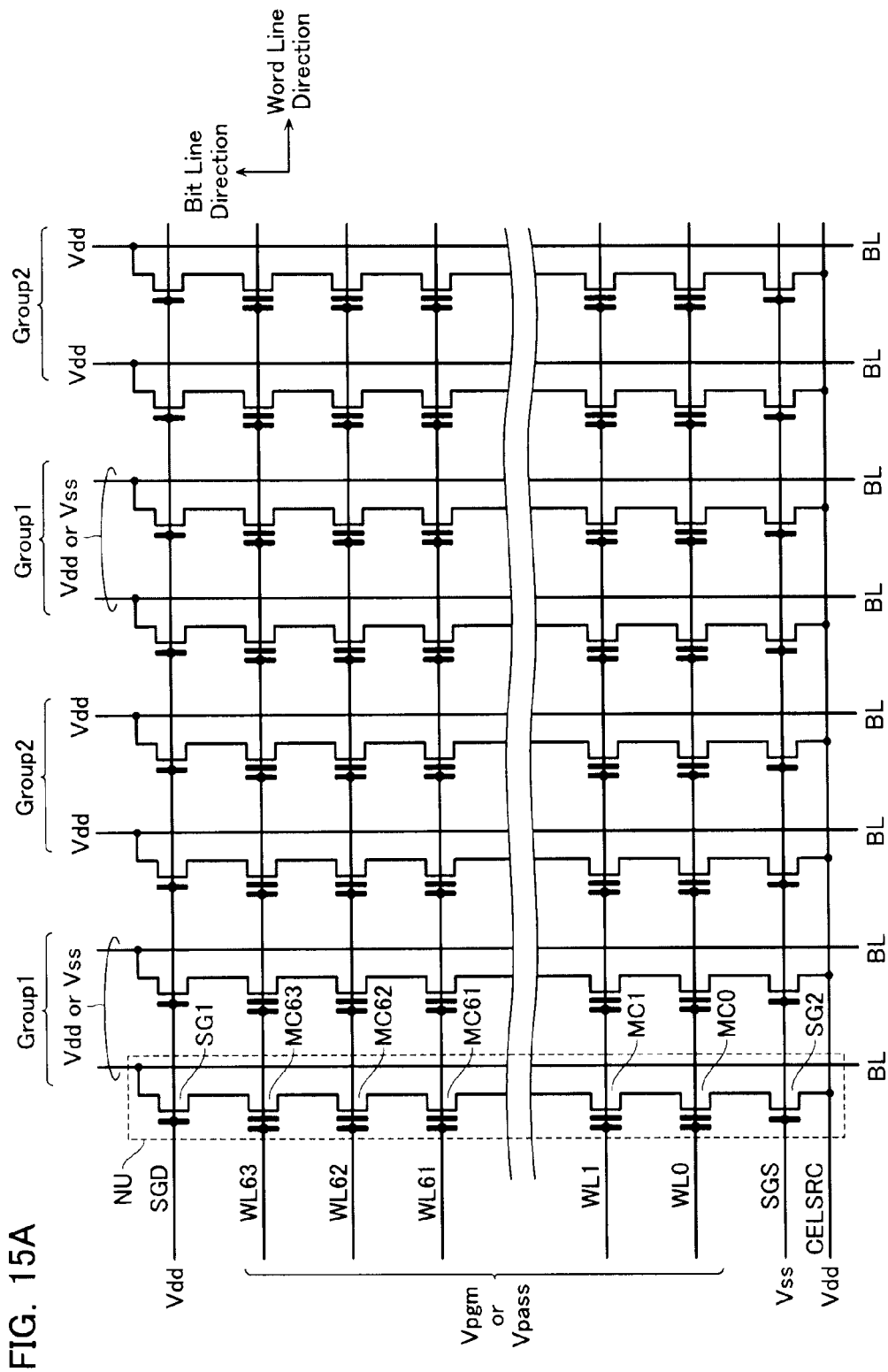

NONVOLATILE SEMICONDUCTOR MEMORY DEVICE

CROSS REFERENCE TO RELATED APPLICATIONS

This application is based on and claims the benefit of priority from prior Japanese Patent Application No. 2011-164479, filed on Jul. 27, 2011, the entire contents of which are incorporated herein by reference.

FIELD

The embodiments described in this specification relate to a nonvolatile semiconductor memory device.

BACKGROUND

NAND type flash memory is widely employed as a semiconductor memory device for storing data in a nonvolatile manner. Due to the need for multi-functionality in electronic appliances in which such NAND type flash memory is installed, the NAND type flash memory itself requires to have its storage capacity increased, which in turn requires miniaturization of size and wiring pitch of storage elements.

A NAND type flash memory normally employs a memory transistor having a MOSFET structure of a stacked floating gate and control gate. A NAND cell unit in the NAND type flash memory is configured by a plurality of such memory transistors connected in series. One end of the NAND cell unit is connected to a bit line via a select gate transistor and the other end of the NAND cell unit is connected to a source line similarly via a select gate transistor.

To meet requirements for further miniaturization, for example, the so-called sidewall transfer process is employed in manufacture of the latest NAND type flash memory. In the sidewall transfer process, patterning of resist is performed with a minimum processing dimension F, and a slimming process is executed that further thins the patterned resist. Subsequently, the resist is used as a mask to process a hard mask, and a sidewall film is deposited on sidewalls of that hard mask. Then, an etching process is performed that allows the sidewall film to remain while removing the hard mask only. This remaining sidewall film is employed to perform etching of material film in layers below the sidewall film. This enables various kinds of wiring and so on to be formed with a width and pitch that are smaller than the minimum processing dimension F.

However, progress in miniaturization leads to interference effects on adjacent memory cells increasing, which in turn causes a write operation to be greatly affected.

BRIEF DESCRIPTION OF THE DRAWINGS

FIG. 15A is a conceptual diagram showing operation of the nonvolatile semiconductor memory device according to the first embodiment.

DETAILED DESCRIPTION

A nonvolatile semiconductor memory device in an embodiment described below comprises a semiconductor substrate having a memory cell array and a control circuit. A plurality of element isolation insulating films are formed in the semiconductor substrate in the memory cell array and have a first direction as a long direction. A plurality of element formation regions are formed isolated by the element isolation insulating films. A memory string is formed in each of the element formation regions. A plurality of element formation region groups are each configured by the element formation regions. In a memory cell array, in a second direction orthogonal to the first direction, a spacing between the element formation region groups is larger than a spacing between the element formation regions in the element formation region groups. A control circuit executes a write operation on the memory cell array on an element formation region group basis.

Next, a nonvolatile semiconductor memory device according to an embodiment of the present invention is described with reference to the drawings.

[First Embodiment]

Figure 1A:
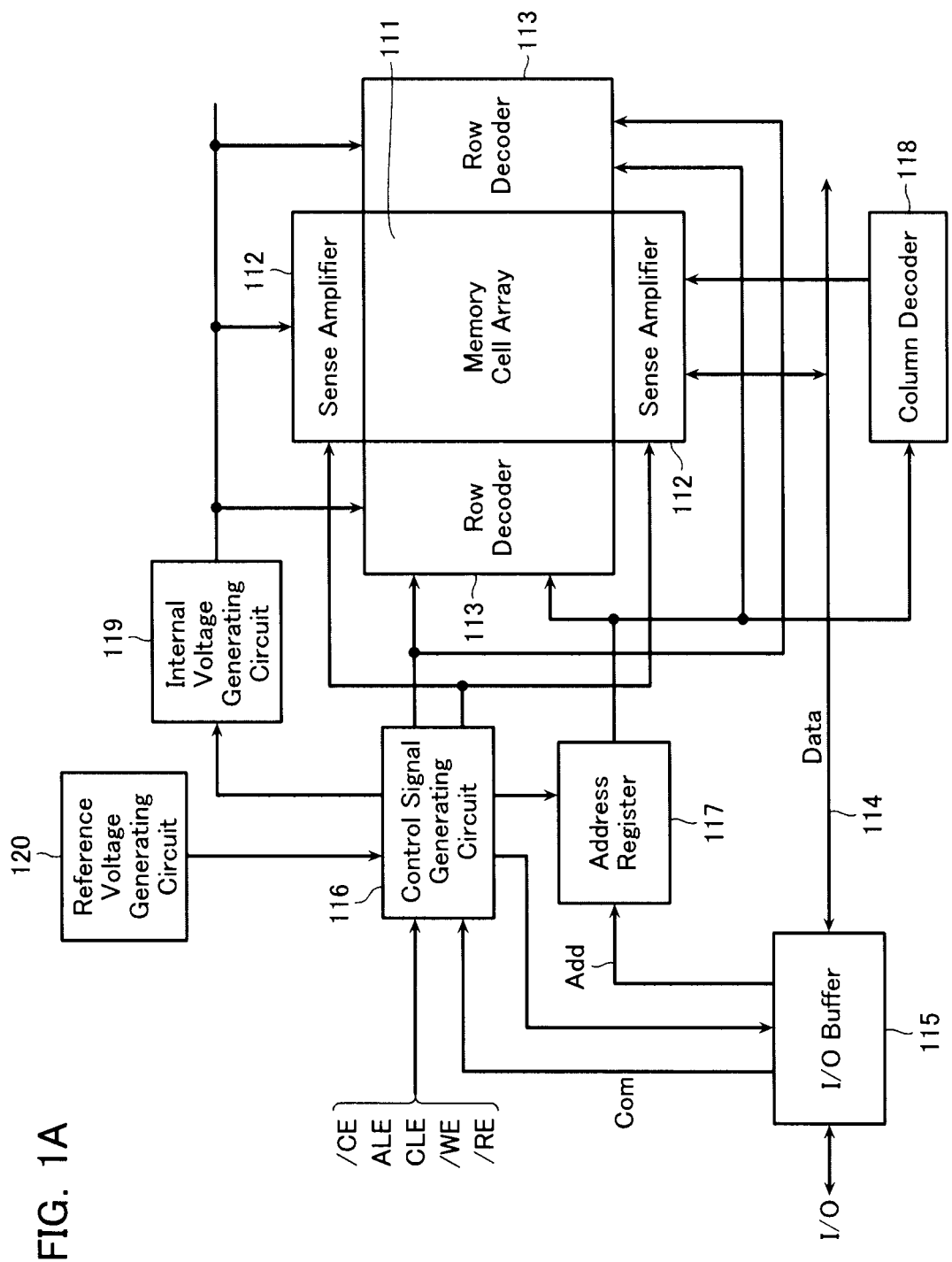
FIG. 1A is a block diagram showing a configuration of a nonvolatile semiconductor memory device according to a first embodiment.
Figure 1B:
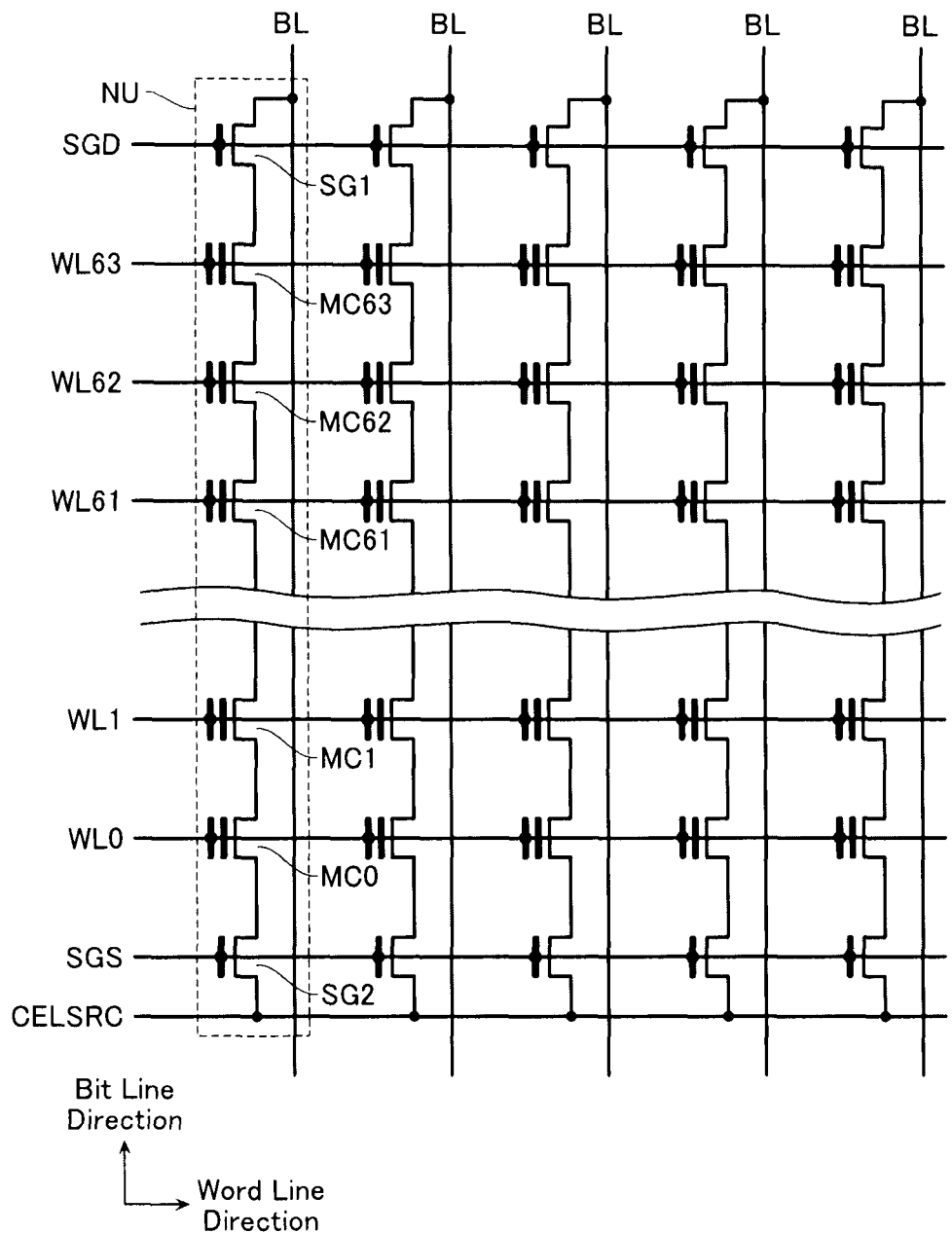
FIG. 1B is an equivalent circuit diagram showing the configuration of the nonvolatile semiconductor memory device according to the first embodiment.

First, a configuration of a nonvolatile semiconductor memory device according to a first embodiment is described with reference to FIGS. 1A and 1B. FIG. 1A is a block diagram showing the configuration of the nonvolatile semiconductor memory device (NAND type flash memory) according to the first embodiment. FIG. 1B is an equivalent circuit diagram showing a configuration of a memory cell array 111. Note that in FIG. 1B, a direction in which word lines WL extend is termed a word line direction, and a direction in which bit lines BL extend is termed a bit line direction.

As shown in FIG. 1A, the nonvolatile semiconductor memory device according to the first embodiment includes the memory cell array 111, a sense amplifier 112, a row decoder 113, a data line 114, an I/O buffer 115, a control signal generating circuit 116, an address register 117, a column decoder 118, an internal voltage generating circuit 119, and a reference voltage generating circuit 120.

As shown in FIG. 1B, the memory cell array 111 is configured having NAND cell units NU arranged in a matrix. Each of the NAND cell units NU includes, for example, electrically rewritable nonvolatile memory cells MC0-MC63 (memory string) connected in series, and select transistors SG1 and SG2 for connecting the two ends of that memory string to, respectively, a bit line BL and a common source line CELSRC.

Control gates of the memory cells MC0-MC63 in the NAND cell unit NU are connected to different word lines WL0-WL63. Gates of the select transistors SG1 and SG2 are connected to, respectively, select gate lines SGD and SGS. An assembly of NAND cell units NU sharing one word line WL configure a block BLK which is a unit of data erase. Although not shown in the drawings, a plurality of blocks BLK are arranged in the bit line direction.

Each of the bit lines BL is connected to the sense amplifier 112 shown in FIG. 1A. The plurality of memory cells MC commonly connected to one word line WL configure one page or a plurality of pages.

As shown in FIG. 1A, the sense amplifier 112 is disposed in the bit line direction of the memory cell array 111 and, as well as being connected to the bit lines BL to perform data read in page units. The sense amplifier 112 also serves as a data latch for retaining one page of write data. That is, read and write are performed in page units. The sense amplifier 112 is provided with a data cache for temporarily retaining input/output data, and a column select gate circuit (not shown) for performing column selection.

As shown in FIG. 1, the row decoder 113 is disposed in the word line direction of the memory cell array 111 and selectively drives the word lines WL and the select gate lines SGD and SGS according to a row address. This row decoder 113 includes a word line driver and a select gate line driver. Moreover, the column decoder 118 for controlling a column select gate circuit in the sense amplifier 112 is provided accompanying the sense amplifier 112. The row decoder 113, the column decoder 118, and the sense amplifier 112 configure a read/write circuit for performing data read and write in the memory cell array 111.

Data transfer between an external input/output port I/O and the sense amplifier 112 is performed by the input/output buffer 115 and the data line 114. That is, page data read by the sense amplifier 112 is outputted to the data line 114, and outputted via the input/output buffer 115 to the input/output port I/O. In addition, write data supplied from the input/output port I/O is loaded into the sense amplifier 112 via the input/output buffer 115.

Address data Add supplied from the input/output port I/O is supplied via the address register 117 to the row decoder 113 and the column decoder 118. Command data Com supplied from the input/output port I/O is decoded to be set in the control signal generating circuit 116.

Each of the following external control signals, namely a chip enable signal /CE, an address latch enable signal ALE, a command latch enable signal CLE, a write enable signal /WE, and a read enable signal /RE, are supplied to the control signal generating circuit 116. The control signal generating circuit 116 performs operation control of memory operations in general based on the command Com and the external control signals, and, in addition, controls the internal voltage generating circuit 119 to generate various kinds of internal voltages required in data write, read, and erase. Moreover, the control signal generating circuit 116 is applied with a reference voltage from the reference voltage generating circuit 20. The control signal generating circuit 116 performs write from a selected memory cell M on the source line SL side and controls a read operation.

Figure 1C:
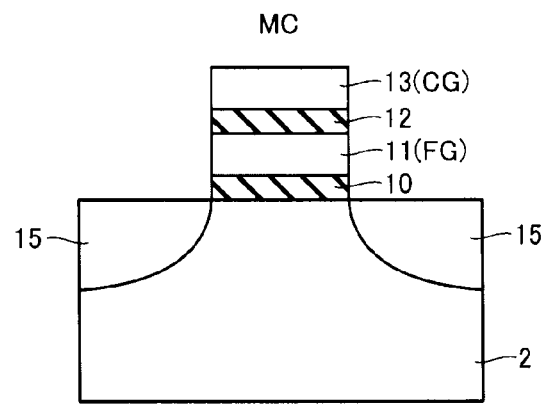
FIG. 1C is a schematic view showing across-sectional structure of a memory cell MC.
Figure 1D:
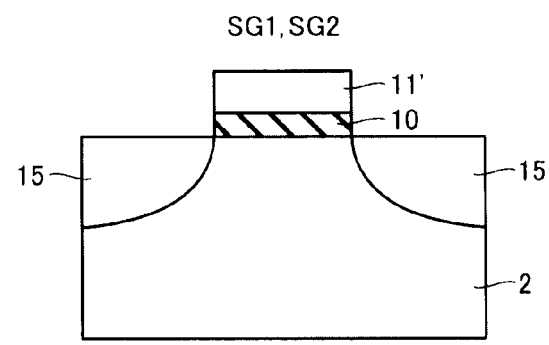
FIG. 1D is a schematic view showing a cross-sectional structure of select transistors SG1 and SG2.

FIGS. 1C and 1D show a schematic cross-sectional structure of the memory cell MC and the select transistors SG1 and SG2, respectively. Formed on a p-type well 2 which is formed on a semiconductor substrate not shown are n-type source and drain diffusion layers 15. A region of the p-type well 2 sandwiched by the two diffusion layers 15 functions as a channel of a MOSFET configuring the memory cell MC.

In addition, a floating gate (FG) 11 is formed on the p-type well 2 via a gate insulating film 10. The floating gate 11 is configured capable of retaining charges therein, and a threshold voltage of the memory cell is determined by an amount of the charges. Note that a charge trap film may be employed as a charge storage film in place of a floating gate. A control gate (CG) 13 is formed on this floating gate 11 via an intergate insulating film 12.

The select transistors SG1 and SG2 comprise a p-type well 2 formed on a semiconductor substrate not shown and n-type source and drain diffusion layers 15 formed on a surface of this p-type well 2. Note that a source and drain utilizing a fringe electric field may be employed in place of a diffusion layer. A control gate 11' is formed on this p-type well 2 via a gate insulating film 10.

Figure 1E:
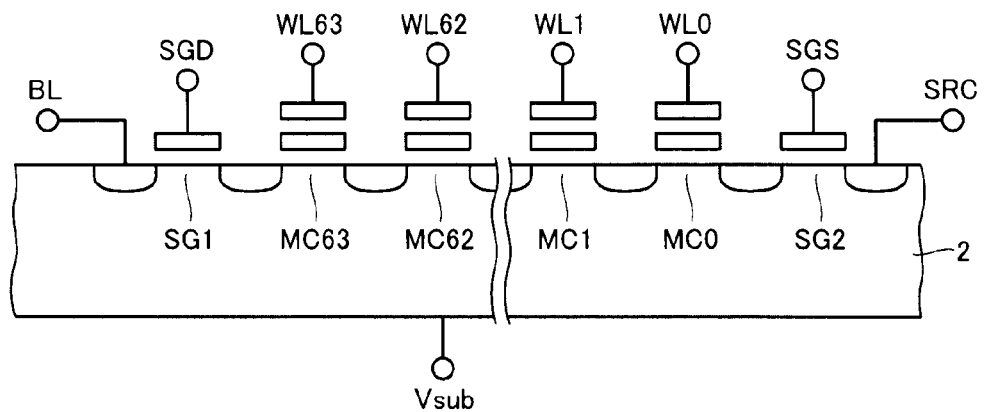
FIG. 1E is a schematic view showing a cross-sectional structure of a NAND cell unit NU.

FIG. 1E shows a schematic cross-sectional view of one NAND cell unit NU in the memory cell array 111. In this example, one NAND cell unit NU is configured having 64 memory cells MC with a structure that is shown in FIG. 1C and the select transistors SG1 and SG2 of the configuration shown in FIG. 1D connected in series.

Figure 2:
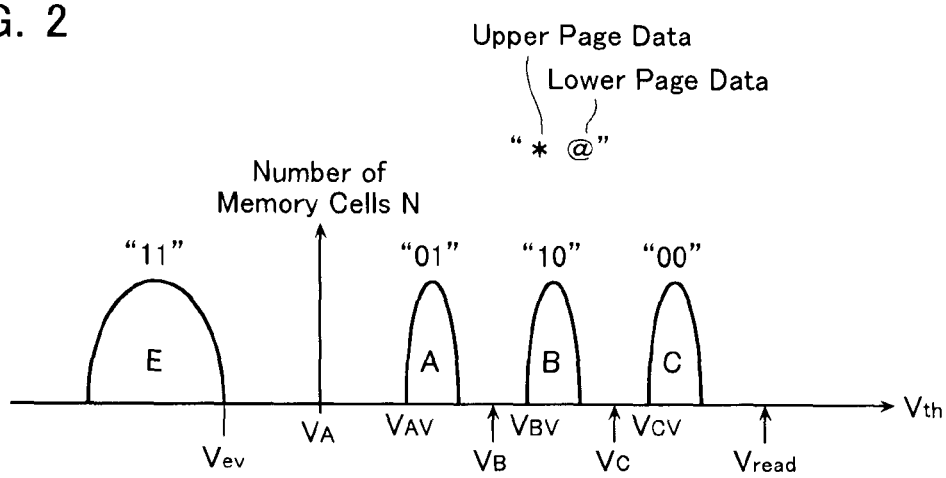
FIG. 2 is a schematic view explaining a multi-level storage system in a NAND type flash memory.
Figure 3:
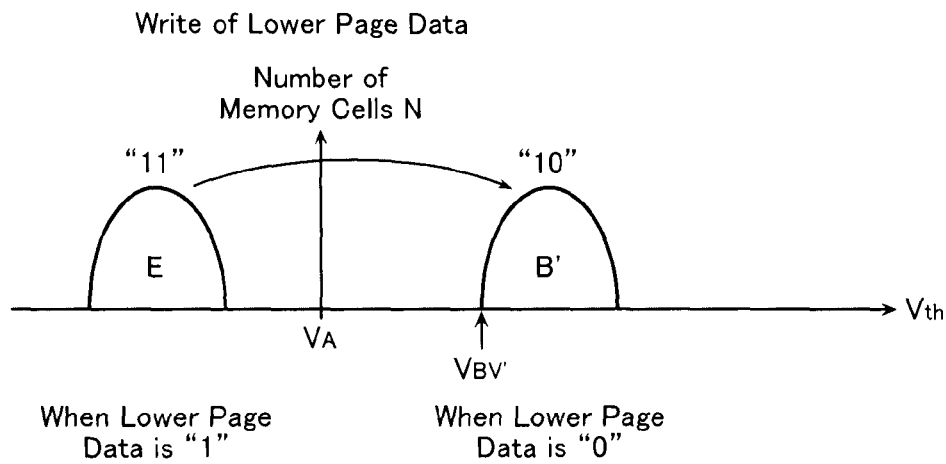
FIG. 3 is a schematic view explaining the multi-level storage system in a NAND type flash memory.

Next, a multi-level storage system in a NAND type flash memory configured in this way is described with reference to FIGS. 2-4. As shown in FIG. 2, the NAND type flash memory controls a value of the threshold voltage in one memory cell MC in, for example, four ways to enable two bits of data to be stored in that one memory cell MC. A four-level data storage system is described below as an example. Even if a multi-level data storage system other than the four-level data storage system, for example, an eight-level (three bit) or more data storage system is adopted, the basic principle is similar and it is only the number of threshold voltage distributions that differs.

To store two bits of information, four kinds of threshold voltage distributions (E, and A-C) are provided corresponding to four types of data, namely, "11", "01", "10", and "00", whereby write and read of information is performed. That is, each of four types of threshold voltage distributions (E, and A-C) has one of four types of bit information (11, 01, 10, and 00) allocated thereto. Two sub-pages, that is, an upper page UPPER and a lower page LOWER, are formed corresponding to these two bits of data.

During a read operation of these four types of data, a read voltage is applied to a selected word line WL connected to the memory cell MC to perform detection of conductivity/non-conductivity of the memory cell MC. A voltage value of the read voltage applied to the selected word line WL may be set to voltages VA, VB, and VC (three types) between an upper limit and a lower limit of each of the threshold voltage distributions as shown in FIG. 2, corresponding to the four types of threshold voltage distributions of the memory cell (refer to FIG. 2). Read voltage VA is the lowest voltage, and voltage values increase in the order of VB and VC. Note that a voltage Vread applied to unselected memory cells MC during the read operation is set to a voltage larger than an upper limit value of the threshold voltage distribution C allocated with data "10". That is, the voltage Vread is the voltage applied to unselected memory cells in the NAND cell when performing read of data, and renders the unselected memory cells conductive irrespective of retained data of those unselected memory cells.

Voltages VAV, VBV, and VCV in FIG. 2 indicate verify voltages applied to verify whether write has been completed when write is performed to each of the threshold voltage distributions.

Furthermore, Vev is an erase verify voltage applied to a memory cell to verify if erase is completed or not when erasing data in the memory cell, and has a negative value. The magnitude of Vev is determined with consideration for effects of interference with adjacent memory cells. The magnitude relationship of each of the above-mentioned voltages is Vev<VA<VAV<VB<VBV<VC<VCV<Vread. Note that, as previously mentioned, the erase verify voltage Vev has a negative value, but the voltage actually applied to a control gate of a memory cell MC in an erase verify operation is not a negative value, but zero or a positive value. That is, in an actual erase verify operation, a back gate of the memory cell MC is applied with a positive voltage, and the control gate of the memory cell MC is applied with zero or a voltage having a value smaller than the back gate voltage.

The threshold voltage distribution E of the memory cell after block erase also has an upper limit value that is a negative value, and is allocated with data "11". In addition, memory cells in write states of data "01", "10", and "00" have, respectively, positive threshold voltage distributions A, B, and C (lower limit values of A, B, and C are also positive values). Threshold voltage distribution A of data "01" has the lowest voltage value, threshold voltage distribution C of data "00" has the highest voltage value, and threshold voltage distribution B of data "10" has an intermediate voltage value between those of data "01" and "00". Note that the threshold voltage distributions shown in FIG. 2 are purely one example. For example, FIG. 2 was described assuming that the threshold voltage distributions A, B, and C are all positive threshold voltage distributions, but it is also possible for threshold voltage distribution A to be a distribution of negative voltages while threshold voltage distributions B and C are distributions of positive voltages. Moreover, the threshold voltage distribution E may be a distribution of positive voltages.

The two-bit data of one memory cell is configured from lower page data and upper page data, and the lower page data and the upper page data are written to the memory cell by separate write operations, in other words, by two times of write operations. When notation data "*@" is used below, * represents the upper page data and @ represents the lower page data.

First, write of lower page data is described with reference to FIG. 3. All the memory cells are assumed to have the threshold voltage distribution E of an erase state, and to be storing data "11". As shown in FIG. 3, when write of lower page data is performed, the threshold voltage distribution E of the memory cells is divided into two threshold voltage distributions (E and B') according to a value ("1" or "0") of the lower page data. That is, when the value of lower page data is "1", the threshold voltage distribution E of the erase state is maintained.

On the other hand, when the value of lower page data is "0", a high electric field is applied to a tunnel oxide film of the memory cell, and electrons are injected into the floating gate electrode to raise a threshold voltage Vth of the memory cell by a certain amount. Specifically, a verify potential VBV' is set, and the write operation is repeated until a threshold voltage of this verify voltage VBV' or more is attained. As a result, the memory cell changes to a write state (data "10").

Next, write of upper page data is described with reference to FIG. 4. Write of upper page data is performed based on write data (upper page data) inputted from outside of the chip, and the lower page data already written to the memory cell.

Figure 4:
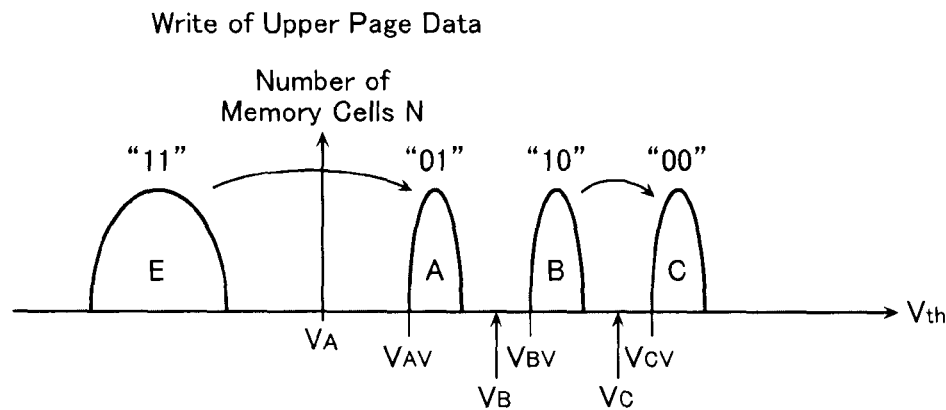
FIG. 4 is a schematic view explaining the multi-level storage system in a NAND type flash memory.

That is, as shown in FIG. 4, when the value of upper page data is "1", a high electric field is prevented from being applied to the tunnel oxide film of the memory cell, thereby preventing a rise in the threshold voltage Vth of the memory cell. As a result, a memory cell of data "11" (threshold voltage distribution E of the erase state) is maintained unchanged as data "11", and a memory cell of data "10" (threshold voltage distribution B') is maintained unchanged as data "10". However, a regular verify voltage VBV larger than the above-mentioned verify voltage VBV' is used to adjust a lower limit value of the threshold voltage distribution, thereby forming the threshold voltage distribution B having a narrowed width of threshold voltage distribution.

On the other hand, when the value of upper page data is "0", a high electric field is applied to the tunnel oxide film of the memory cell, and electrons are injected into the floating gate electrode to raise the threshold voltage Vth of the memory cell by a certain amount. As a result, a memory cell of data "11" (threshold voltage distribution E of the erase state) changes to data "01" of threshold voltage distribution A, and a memory cell of data "10" changes to data "00" of threshold voltage distribution C. At this time, verify voltages VAV and VCV are used to adjust a lower limit value of threshold voltage distributions A and C.

The above is one example of a data write system in a general four-level storage system. This is purely one example, and various alternative methods of allocation of data to the threshold voltage distributions, procedure of the write operation, and so on, may be adopted. Moreover, multi-bit storage systems of three bits or more also only add to the above-described operation an operation that divides the threshold voltage distributions into eight types corresponding to a further higher level of page data, and have a basic operation which is similar to the above-described operation.

Figure 5:
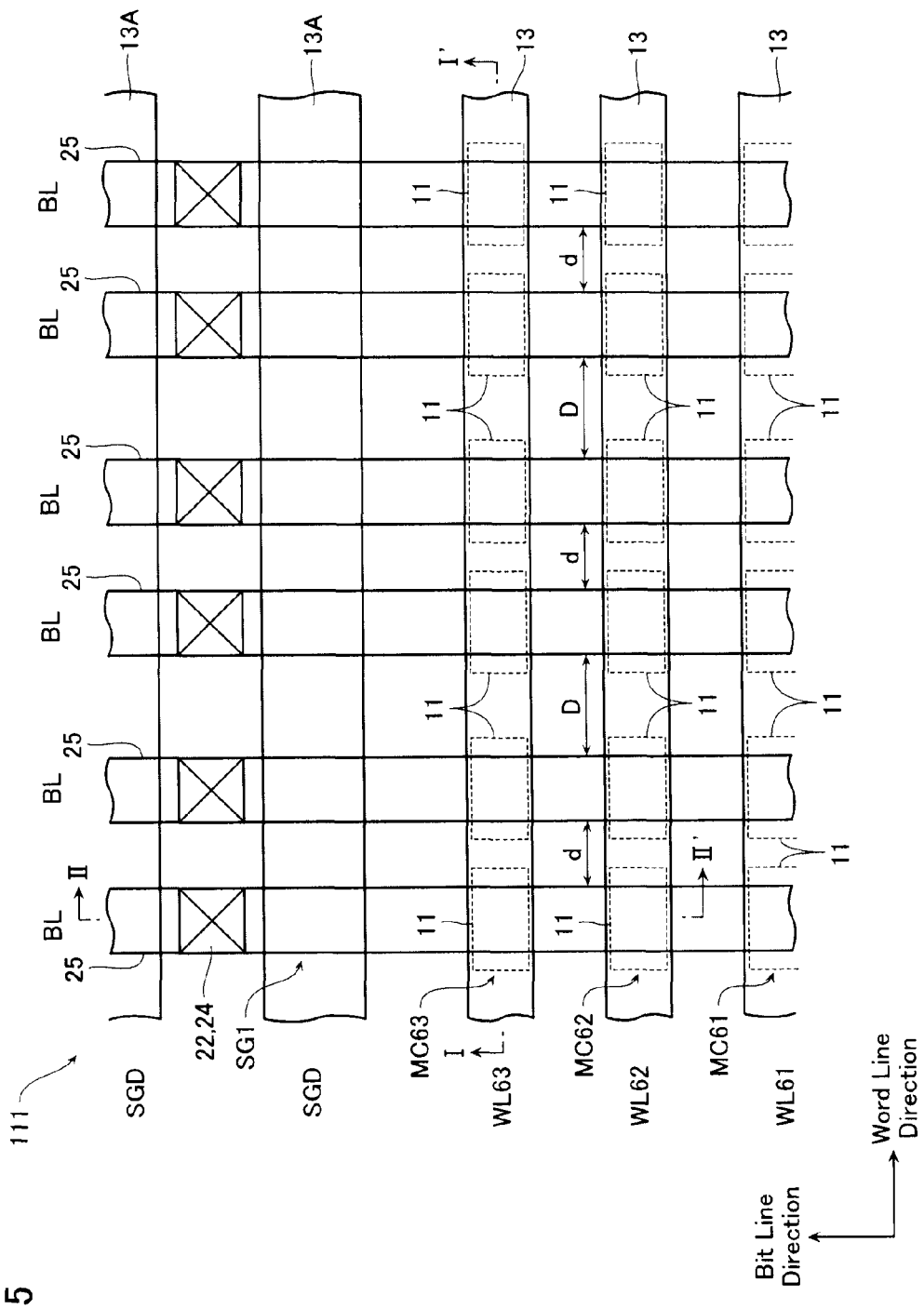
FIG. 5 is a layout view showing the configuration of the nonvolatile semiconductor memory device according to the first embodiment.

FIG. 5 shows a planar layout of the memory cell array 111. Word lines (WL) 13 and bit lines (BL) 25 are disposed intersecting one another, and the memory cell MC is formed at each of intersections 11 of those word lines 13 and bit lines 25. A plurality of the memory cells MC aligned in the bit line direction are connected in series to configure a NAND cell unit NU as described later. One end of the NAND cell unit NU is connected to the bit line BL via the select gate transistor SG1.

Gates of the select gate transistors SG1 are disposed continuously as a select gate line (SGD) 13A parallel to the word lines WL. A width between the word line 13 and the select gate line 13A in the bit line direction is set broader than a width between the word lines 13. Although omitted from FIG. 5, the other end of the NAND cell unit NU is connected to the source line CELSRC via the select gate transistor SG2.

Figure 6:
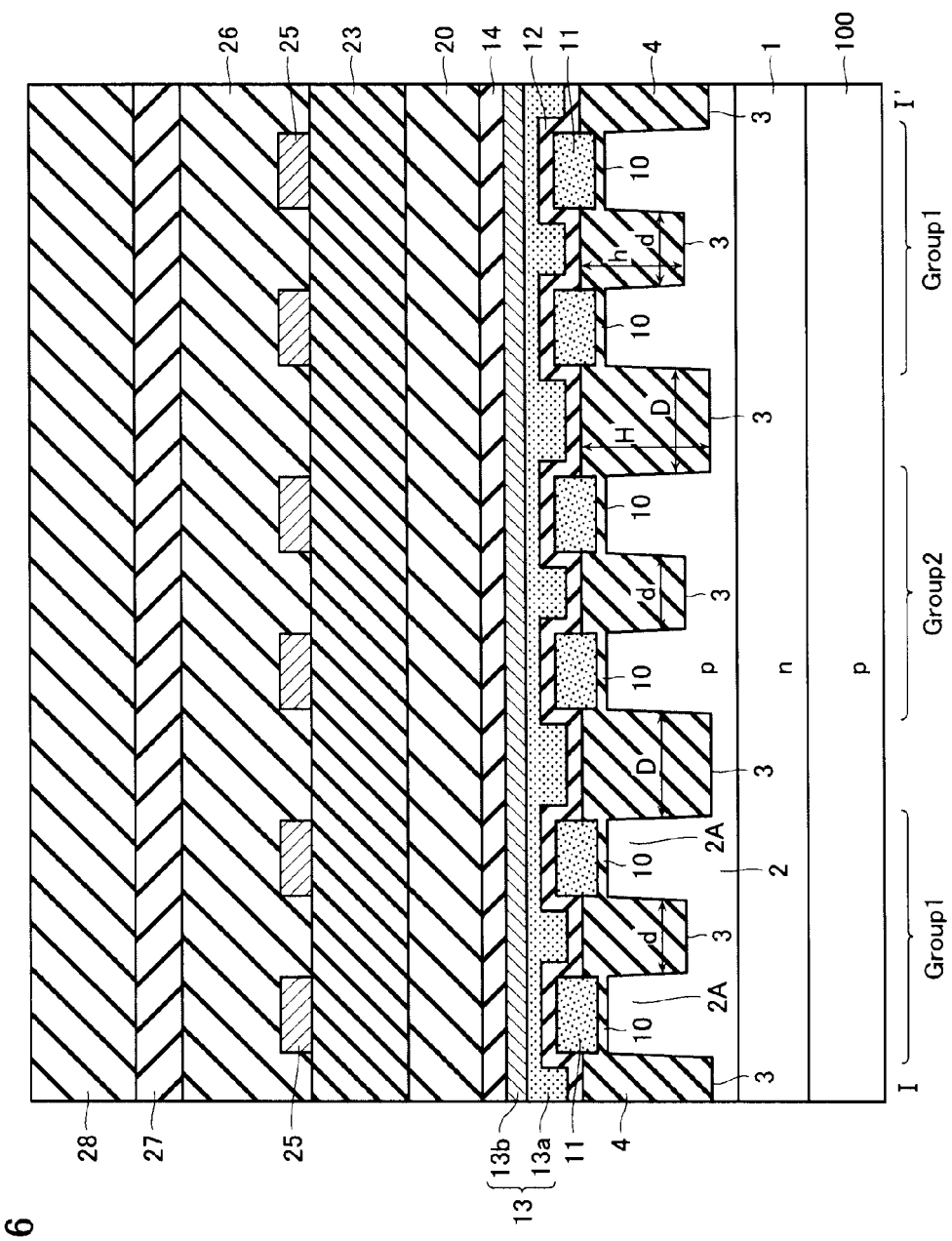
FIG. 6 is a cross-sectional view taken along the line I-I' in FIG. 5.
Figure 7:
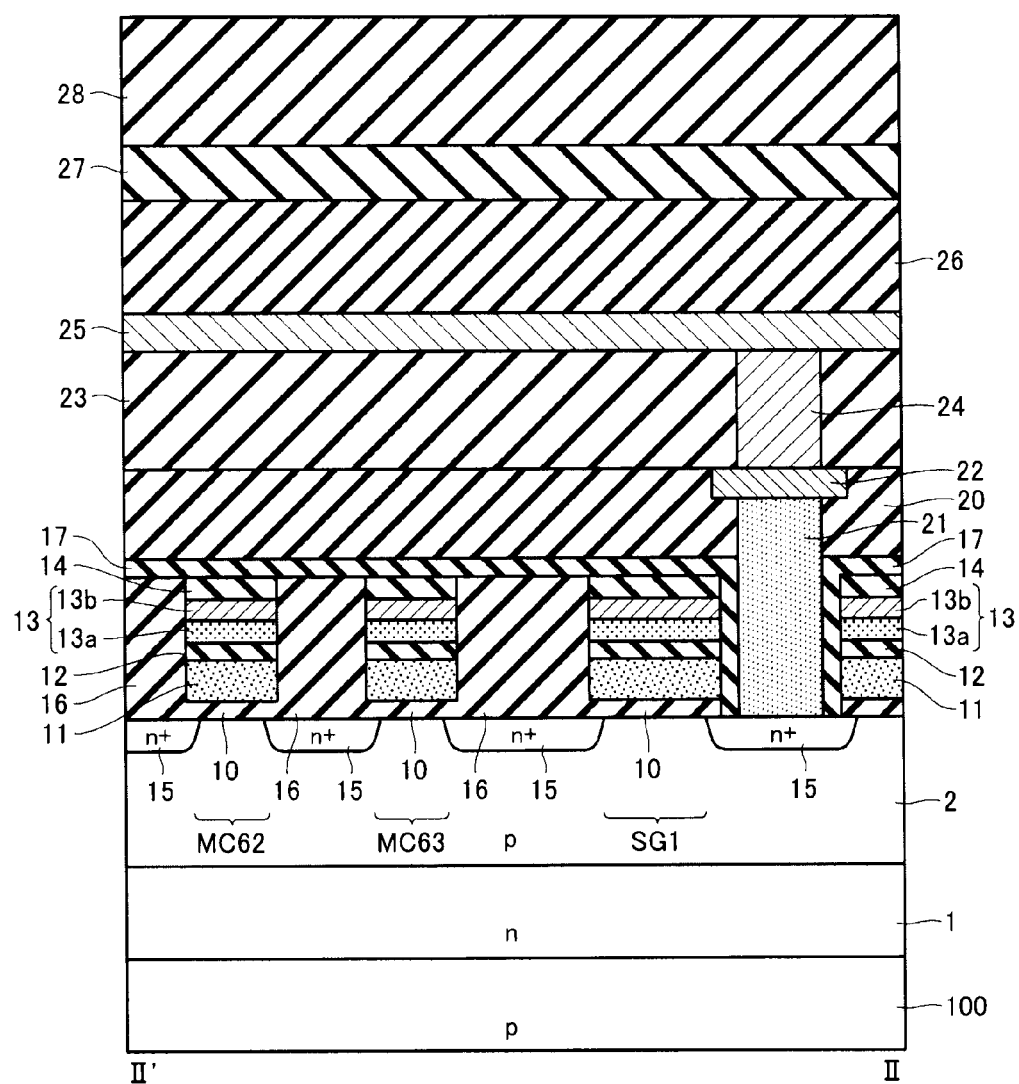
FIG. 7 is a cross-sectional view taken along the line II-II' in FIG. 5.

FIG. 6 is a cross-sectional view taken along the line I-I' of along a word line WL in FIG. 5, and FIG. 7 is, similarly, a cross-sectional view taken along the line II-II' of along a bit line BL in FIG. 5. An n-type well 1 and a p-type well 2 are formed in a cell array region on a p-type silicon substrate 100. A trench 3 is formed in this p-type well 2 with a certain spacing (D, d), and an element isolation insulating film 4 is formed in this trench 3. The memory cell MC is formed in the p-type well 2 sandwiched by this element isolation insulating film 4. That is, the p-type well 2 sandwiched by the element isolation insulating film 4 functions as an element formation region 2A which extends having the bit line direction as a long direction and in which the memory cell MC and so on are formed.

As described later, a plurality of the element formation regions 2A are formed by a sidewall transfer process, whereby a spacing between the element formation regions 2A is a distance d or a distance D (>d). The distance d and the distance D appear periodically. The reason for that is mentioned later. In addition, a depth h of a trench 3 in a distance d portion is configured smaller than a depth H of a trench 3 in a distance D portion. This is because when the width of the trench 3 is small, the depth of the trench 3 also becomes proportionately smaller. Note that the depth h of the trench 3 in the distance d portion is not more than a certain depth h1. Furthermore, the depth H is greater than this depth h1.

Moreover, these element formation regions 2A are grouped into a plurality of element formation region groups Group1 and Group2. The element formation region group Group1 is in an odd-numbered position when viewed from the word line direction and the element formation region group Group2 is in an even-numbered position when viewed from the word line direction. Each of these element formation region groups Group1 and Group 2 forms a single unit on which a write operation is simultaneously performed when performing a write operation. In the present embodiment, one element formation region group Group includes two element formation regions 2A.

The floating gate 11 comprising a polycrystalline silicon film is formed on a surface of the element formation region 2A via the tunnel oxide film 10, and the control gate 13 is formed on this floating gate 11 via the intergate insulating film 12 (for example, an ONO film). The control gate 13 may be formed by a stacked film of a polycrystalline silicon film 13a and tungsten (W) film 13b or by nickel silicide (NiSix).

The control gate 13 undergoes patterning in a continuous manner having the word line direction as a long direction, thereby forming the word line WL.

The control gate 13 and the floating gate 11 undergo patterning simultaneously using a silicon nitride film (SiN film) 14 as a mask, and this is used as a mask to perform ion implantation, whereby the source/drain diffusion layer 15 shown in FIG. 7 is formed. The diffusion layer 15 is shared by adjacent memory cells MC, and a NAND string having a plurality of memory cells MC connected in series is formed, and select gate transistors are connected to the two ends of this NAND string, whereby a NAND cell unit NU is formed. A space between each gate electrode of the memory cell array 111 formed in this way is filled in flatly by an interlayer insulating film 16, and, furthermore, a SiN film 17 is deposited to cover the memory cell array 111.

An interlayer insulating film 20 covers above the memory cell array 111. A contact plug 21 and a tungsten (W) wiring line 22 of a first layer metal are buried in this interlayer insulating film 20. An interlayer insulating film 23 is further stacked. A contact plug 24 is buried in this interlayer insulating film 23, and a bit line (BL) 25 is formed above this by an Al film which is a second layer metal. FIG. 7 shows only a contact portion on a bit line side, and although the W wiring line 22 configures a relay wiring line for the bit line, a source line side has a source wiring line formed by the same film.

A silicon oxide film 26 acting as a passivation film, a SiN film 27 formed by plasma CVD, and a polyimide film 28 are deposited on the bit line 25.

In the present embodiment, the so-called sidewall transfer process is employed when forming the trench 3 or the bit line BL, word line WL, and so on. Here, a procedure when the sidewall transfer process is employed to form the trench 3 is shown with reference to FIGS. 8-14. The bit line BL, word line WL, and so on may be formed by a similar method, hence description of their formation is omitted.

Figure 8:
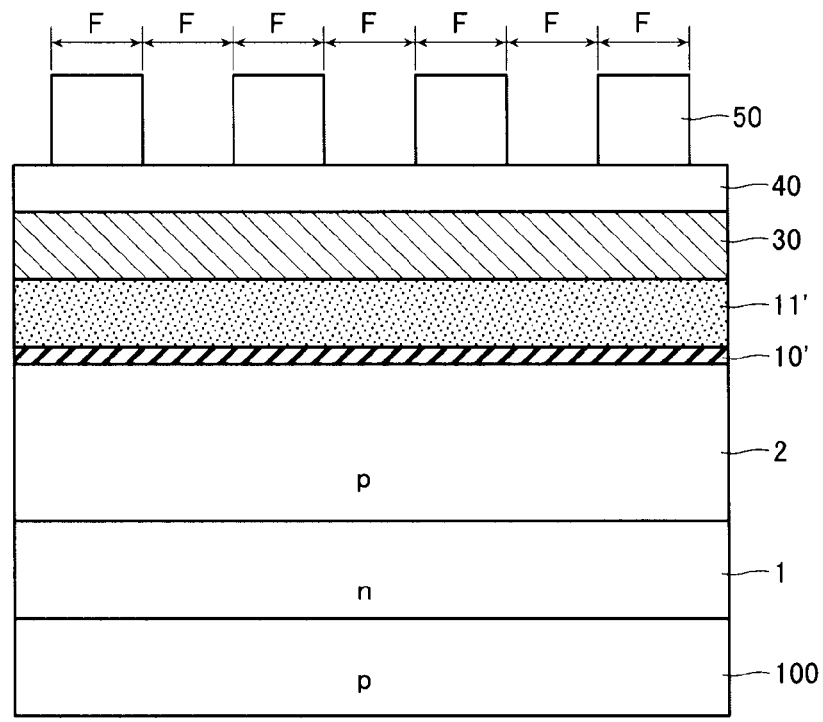
FIG. 8 is a view showing a formation process of an element isolation insulating film 4 by a sidewall transfer process.

First, as shown in FIG. 8, an n-type well 1 and a p-type well 2 are formed sequentially on a p-type silicon substrate 100, and formed sequentially on the p-type well 2 are a silicon oxide film 10' that forms a material of the tunnel oxide film 10 and a polycrystalline silicon film 11' that forms a material of the floating gate 11. Furthermore, a first hard mask 30 employed for etching the p-type well 2, the silicon oxide film 10' and the polycrystalline silicon film 11' is deposited.

The first hard mask 30 can be formed for example by a composite film in which a silicon nitride film (SiN), BSG film, TEOS film, BSG film and so on are deposited. This is purely one example, and hard masks of various forms (number of layers, thickness of each layer, materials, and so on) may be employed giving consideration to etching conditions, mask material and the like.

A second hard mask 40 having a different composition from the first hard mask 30 is further formed on this first hard mask 30. The second hard mask 40 may be formed by amorphous silicon, for example.

Next, after an antireflective film (not shown) and resist are applied to an entire surface of this second hard mask 40, a photolithography method is used to develop the resist in a line-and-space pattern of a minimum processing dimension F (resolution limit), and thereby form a resist 50 having a line-and-space pattern shape.

Figure 9:
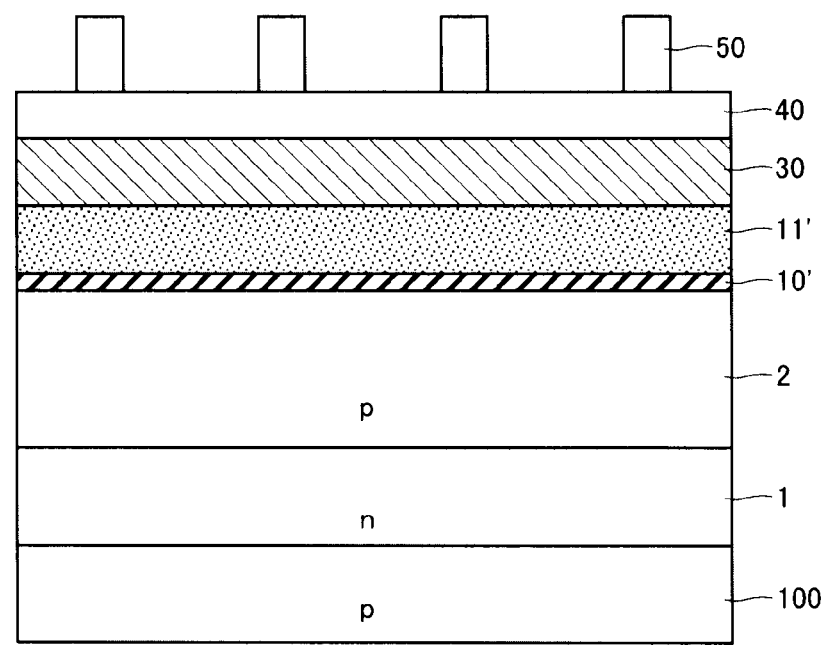
FIG. 9 is a view showing a formation process of the element isolation insulating film 4 by the sidewall transfer process.

Then, as shown in FIG. 9, isotropic etching is used to perform slimming processing of the resist 50 simultaneously to etching the antireflective film not shown, and thereby thin the resist 50 to not more than the minimum processing dimension F (resolution limit) of the photolithography. For example, a line width of the resist 50 in a memory cell array portion is configured to be of the order of approximately ½F and a space width of the resist 50 in a memory cell array portion is configured to be of the order of approximately 3⁄2F.

Figure 10:
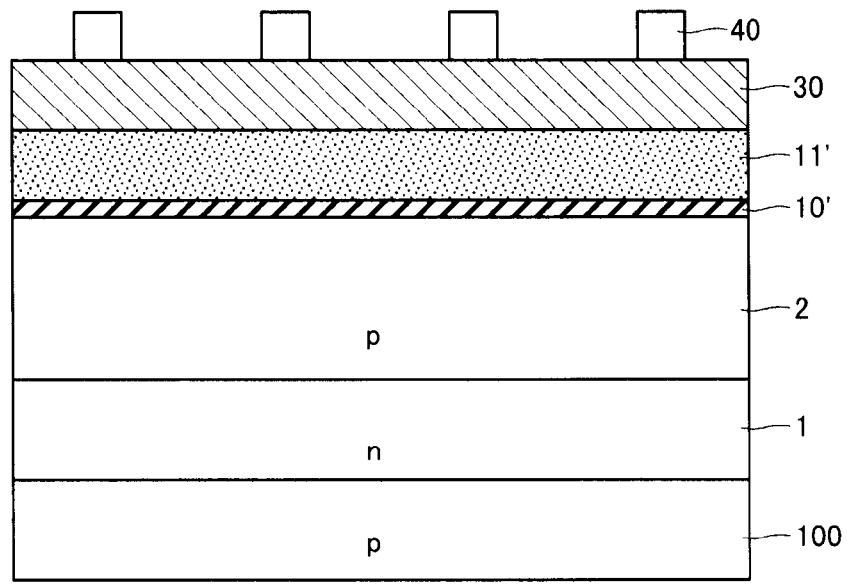
FIG. 10 is a view showing a formation process of the element isolation insulating film 4 by the sidewall transfer process.

As shown in FIG. 10, etching of the second hard mask 40 is performed by isotropic etching using the slimming-processed resist 50 as a mask. After etching, the resist 50 is stripped.

Figure 11:
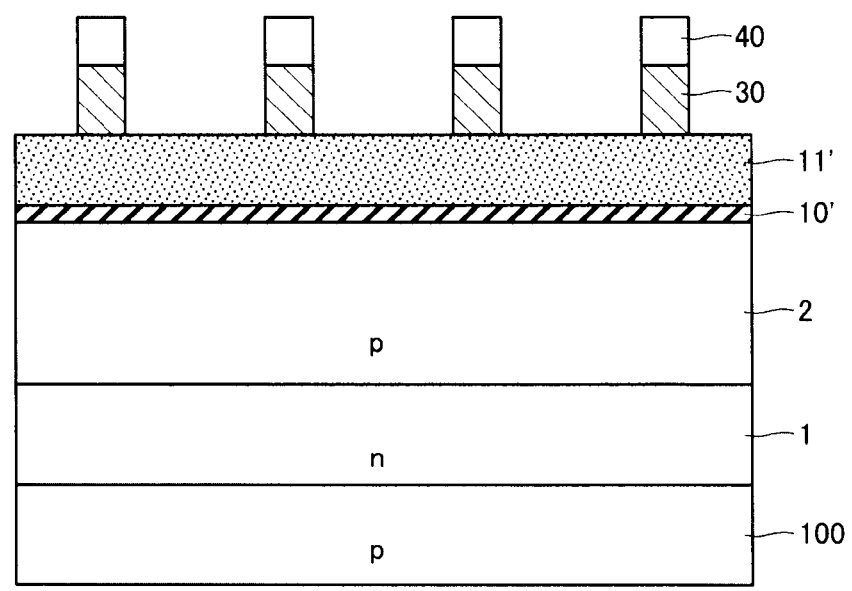
FIG. 11 is a view showing a formation process of the element isolation insulating film 4 by the sidewall transfer process.
Figure 12:
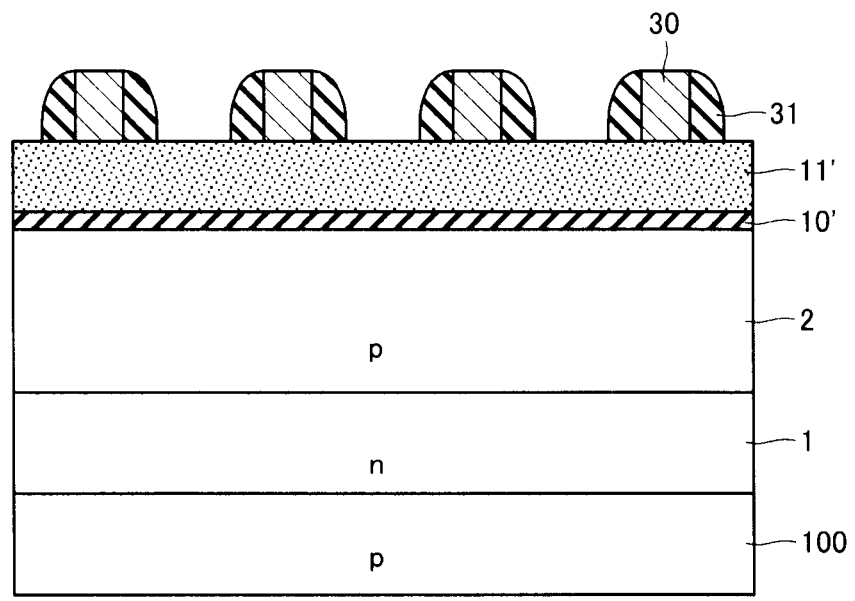
FIG. 12 is a view showing a formation process of the element isolation insulating film 4 by the sidewall transfer process.
Figure 13:
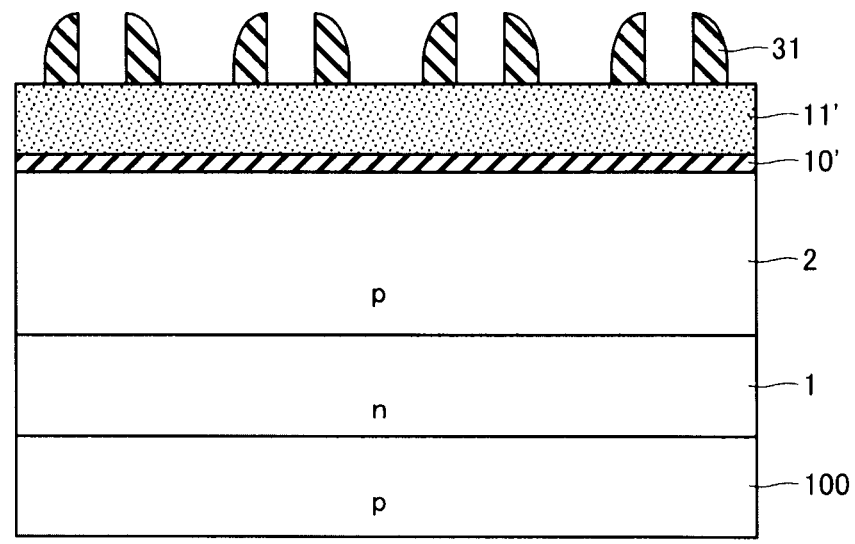
FIG. 13 is a view showing a formation process of the element isolation insulating film 4 by the sidewall transfer process.

Then, as shown in FIG. 11, etching of the first hard mask 30 is performed by isotropic etching using the second mask 40 as a mask. Subsequently, the second hard mask 40 is stripped by isotropic etching. Next, a CVD method is used to deposit a silicon nitride film on an entire surface on the first hard mask 30. Then, as shown in FIG. 12, isotropic etching is used to perform etching such that the silicon nitride film remains on only sidewalls of the first hard mask 30. Then, as shown in FIG. 13, wet etching is performed to remove the hard mask 30, while the silicon nitride film of the sidewalls is left as a sidewall film 31.

Figure 14:
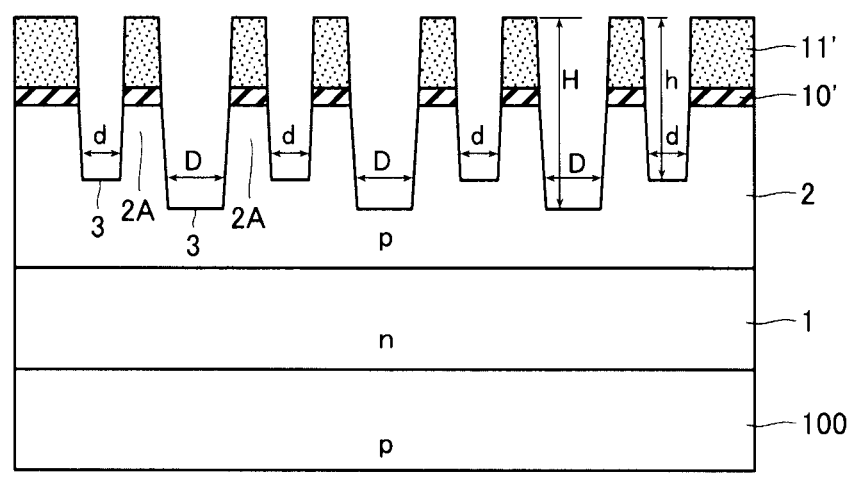
FIG. 14 is a view showing a formation process of the element isolation insulating film 4 by the sidewall transfer process.

As shown in FIG. 14, etching using only such a sidewall film 31 as a mask causes a plurality of trenches 3 to be formed that have a width and spacing which is not more than the minimum processing dimension F.

Figure 23:
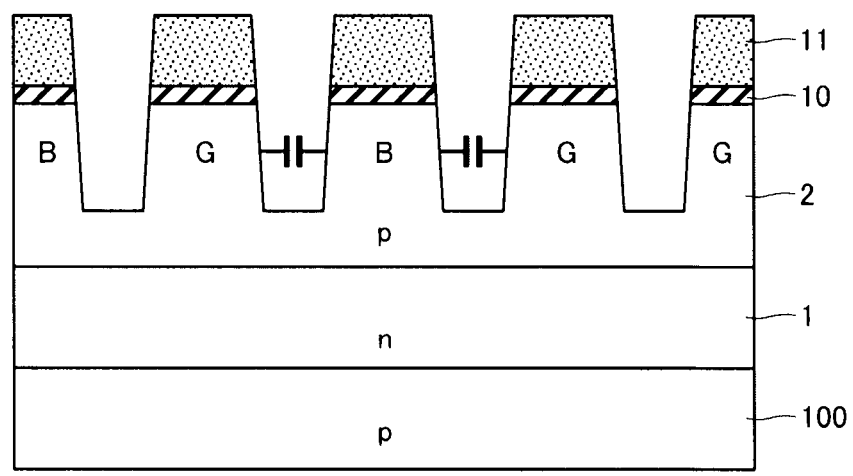
FIG. 23 is a schematic view explaining a problem to be solved by the device of the present embodiment.

In a memory cell array miniaturized in this way, a risk of a mistaken write or the like occurring in the write operation due to interference effects from adjacent memory cells is increased in a conventional memory cell array. That is, as shown in FIG. 23, when performing write to a plurality of memory cells MC along one word line WL, a potential of the element formation region 2A where a memory cell MC is formed becomes either a ground potential (G) or a boost state (B), according to the kind of data to be written to that memory cell MC. An element formation region 2A in which a write-prohibited NAND cell unit NU is present is provided with the boost state (B). The boost state (B) is obtained by a coupling effect due to a potential of a word line WL rising to, for example, a voltage Vread or the like after the select transistors SG1 and SG2 have been set to a non-conductive state to thereby set the element formation region 2A to a floating state.

At this time, there is a problem that if an element formation region 2A in the boost state (B) is adjacent to an element formation region 2A at ground potential (G), there is a risk that capacitive coupling between the element formation regions causes the potential of the element formation region 2A in the boost state (B) to lower, resulting in a mistaken write. The effect becomes large particularly when an element formation region 2A in the boost state (B) is neighbored on both sides by element formation regions 2A at ground potential (G). A state where an element formation region 2A in the boost state (B) is sandwiched on both sides by element formation regions 2A at ground potential (G) in this way is hereinafter referred to as a "GBG state". From a viewpoint of suppressing generation of mistaken writes, such a GBG state must be prevented from occurring as much as possible. As miniaturization advances, this effect will become even greater.

Accordingly, in this embodiment, the sidewall transfer process is used to purposely cause a trench 3 of width d and a trench 3 of width D greater than this width d to be alternately generated. In this example, the trench 3 of distance d and the trench 3 of distance D appear alternately. In other words, spacings (D and d) between a plurality of element formation regions 2A vary periodically as a result of the sidewall transfer process being used. As an example, the width d and the width D can be assumed to have a difference of 10% or more. Note that a portion of the first hard mask 30 removed in the step shown in FIG. 13 may form a trench 3 of larger width D or alternatively a trench 3 of small width d. In whichever case, the widths D and d are similarly not made equal and provided with a difference in width of, for example, 10% or more. FIG. 14 illustrates the case where a trench 3 of width d is caused to be generated in a portion where the first hard mask 30 is removed, but it goes without saying that the present invention is not limited to this. Note that the trench 3 of width D has a depth h greater than that of the trench 3 of width d (<D) (h1>h2).

In the present embodiment, a difference in widths (d, D) of the trenches 3 is thus purposely generated, and, moreover this is utilized positively to perform the write operation accurately.

In the present embodiment, the following write operation is executed. That is, as shown in FIGS. 15A-15D, in the nonvolatile semiconductor memory device of the present embodiment, a plurality of element formation regions 2A insulated and isolated from one another by the element isolation insulating film 4 buried in the trench 3 are grouped into a plurality of groups, for example, two groups, namely Group1 and Group2. Hereinafter, these groups are referred to as element formation region groups Group1 and Group2. The element formation region groups Group1 and Group2 are formed alternately in the word line direction.

When the sidewall transfer process shown in FIGS. 8-14 is employed to form the trench 3, one element formation region group includes two element formation regions 2A. Moreover, the spacing between the two element formation regions 2A in one element formation region group Group1 or Group2 is d. On the other hand, the spacing between two element formation region groups Group1 and Group2 is D, which is larger than d. The spacings d and D both have values having a certain variation. In other words, the median value of d need only be a value 10% or more larger than the median value of D.

In addition, a depth h of the element isolation insulating film 4 isolating the element formation regions 2A in the element formation region group is smaller than a depth H of the element isolation insulating film 4 isolating two element formation region groups Group1 and Group2.

When executing a write operation in the first embodiment, write operations of the two element formation region groups Group1 and Group2 are each executed separately. In other words, an operation is performed that applies a voltage for write to only one of the two element formation region groups Group1 and Group2, and applies a voltage to prohibit write in the remaining element formation region group. The write operation in the first embodiment is described below with reference to FIGS. 15A-15D.

Figure 15B:
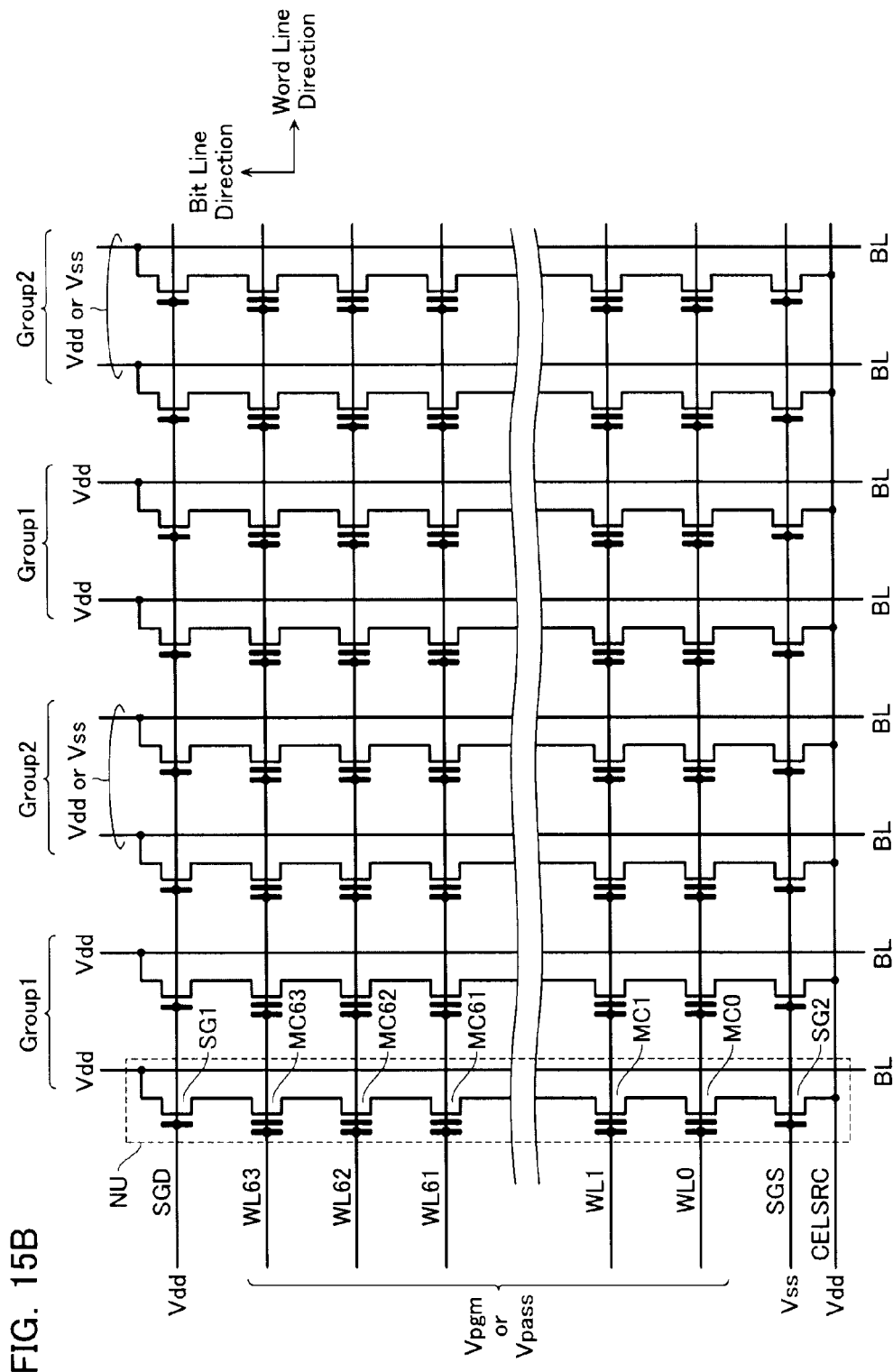
FIG. 15B is a conceptual diagram showing operation of the nonvolatile semiconductor memory device according to the first embodiment.
Figure 15C:
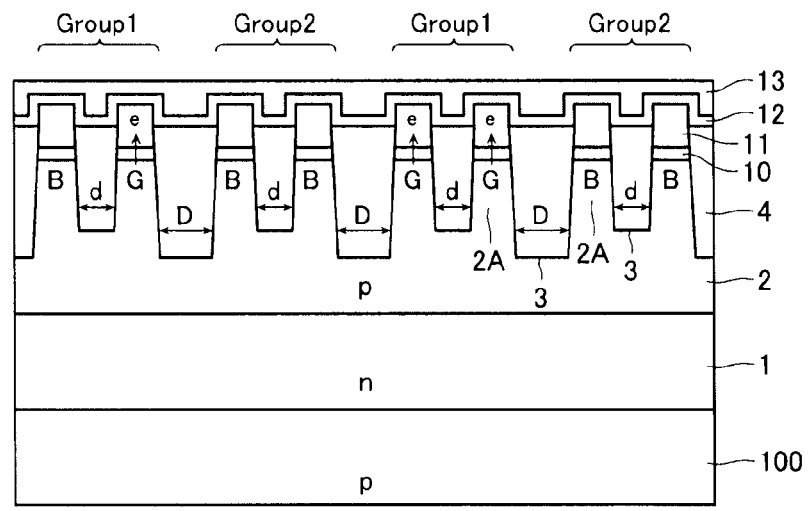
FIG. 15C is a conceptual diagram showing operation of the nonvolatile semiconductor memory device according to the first embodiment.
Figure 15D:
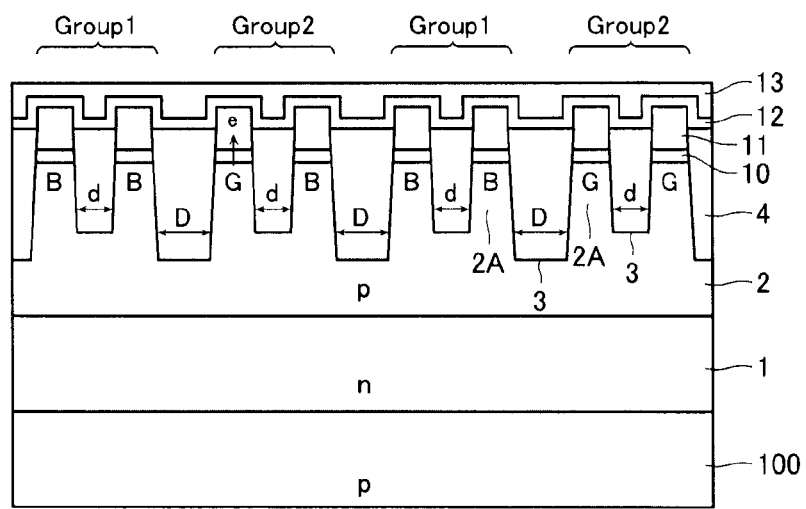
FIG. 15D is a conceptual diagram showing operation of the nonvolatile semiconductor memory device according to the first embodiment.

FIGS. 15A and 15B describe the write operation in the first embodiment using equivalent circuit diagrams. In addition, FIGS. 15C and 15D describe the write operation using cross-sectional views taken along the line I-I' (in FIG. 5). FIGS. 15A and 15C show an operation in the case where the element formation region group Group1 is subjected to the write operation and the element formation region group Group2 is set to write prohibit. Contrarily, FIGS. 15B and 15D show an operation in the case where the element formation region group Group2 is subjected to the write operation and the element formation region group Group1 is set to write prohibit.

(1) Write Operation to Element Formation Region Group Group1

First, an operation in the case where the element formation region group Group1 is subjected to the write operation and the element formation region group Group2 is set to write prohibit is described with reference to FIGS. 15A and 15C.

A selected word line WLs that is selected from among the word lines WL0-63 and is connected to a write object memory cell MCs subject to write is applied with a program voltage Vpgm (20 V or more). On the other hand, a non-selected word lines WLns connected to a remaining memory cells (non-write object memory cell MCns) not subject to write are applied with a pass voltage Vpass (about 8 V-10 V) sufficient to enable the non-write object memory cell MCns to be rendered conductive irrespective of retained data in the non-write object memory cell MCns.

In addition, the source line CELSRC is applied with a power supply voltage Vdd (for example, 1.8 V), and the select gate line SGS is applied with a ground voltage Vss. As a result, the select gate transistor SG2 is rendered in a non-conductive state (OFF).

As shown in FIG. 15A, the bit lines BL connected to the two NAND cell units NU formed in the element formation region group Group1 are provided with the power supply voltage Vdd or the ground voltage Vss, according to write data. That is, when writing data "0" to the write object memory cell MCs, the bit line BL is applied with the ground voltage Vss. In this case, the select gate line SGD being provided with the power supply voltage Vdd causes the select gate transistor SG1 to be in a conductive state (ON) and the corresponding element formation region 2A to be charged to the ground voltage Vss. As a result, electrons are injected into the floating gate 11 of the write object memory cell MCs due to a potential difference between the program voltage Vpgm applied to the selected word line WLs and the ground voltage Vss, this causing a threshold voltage of the write object memory cell MCs to rise. On the other hand, when maintaining retained data of the write object memory cell MCs at "1" (the case of write prohibit), the bit line BL is applied with the power supply voltage Vdd. In this case, the select gate line SGD being provided with the power supply voltage Vdd causes the select gate transistor SG1 to be in a non-conductive state (OFF) and the corresponding element formation region 2A to be in a floating state. Applying the program voltage Vpgm or the pass voltage Vpass to the word line WL in this state causes the potential of the element formation region 2A to rise further due to coupling (boost state). Therefore, electrons are not injected into the floating gate 11 of the write object memory cell MCs and the threshold voltage of the write object memory cell MCs does not rise.

On the other hand, as shown in FIG. 15A, in the element formation region group Group2 where write is prohibited, all of the bit lines BL are applied with the power supply voltage Vdd. Therefore, the select gate transistors SG1 in the element formation region group Group2 are all in a non-conductive state (OFF), the element formation regions 2A in the element formation region group Group2 are all rendered in a floating state, and, moreover, the word line WL being applied with a high voltage (Vpgm) causes the potential to rise by a coupling effect (boost state), whereby the threshold voltage of the memory cell MCs does not rise.

As shown in FIG. 15C, the element formation regions 2A in the element formation region group Group1 are either at ground potential (G) or in the boost state (B), according to the kind of data to be written. Moreover, the element formation regions 2A in the element formation region group Group2 are all in the boost state (B). As described later, a state where an element formation region 2A in the boost state (B) is sandwiched by two element formation regions 2A provided with the ground potential (G) (hereinafter referred to as "GBG state") does not occur.

(2) Write Operation to Element Formation Region Group Group2

Next, an operation in the case where the element formation region group Group2 is subjected to the write operation and the element formation region group Group1 is set to write prohibit is described with reference to FIGS. 15B and 15D. The operation in this case differs in a voltage applied to the bit line BL from the case (1) and is substantively identical.

(Advantages of First Embodiment)

Next, advantages of the first embodiment are described. Element formation region groups Group1 and Group2 are defined as above, only one of the element formation region groups Group1 and Group2 is subjected to write, and the other is write prohibited. Configuring the spacing between the element formation regions 2A as described above allows the write operation to be executed accurately. This point is described in greater detail with reference to FIG. 16.

Figure 16:
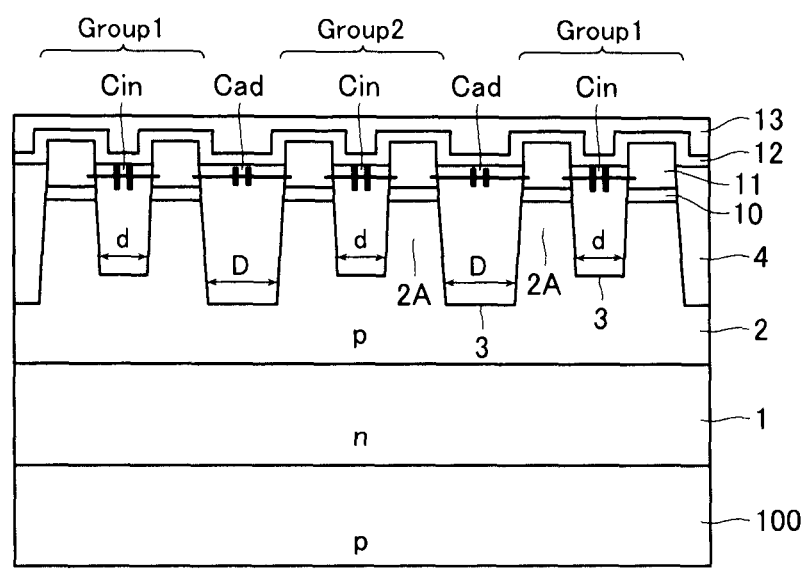
FIG. 16 is a view showing advantages of the nonvolatile semiconductor memory device according to the first embodiment.

In the present embodiment, the spacing D between the element formation region groups Group1 and Group2 is larger than the spacing d between the two element formation regions 2A included in one element formation region group. Therefore, as shown in FIG. 16, a parasitic capacitance Cin between the two element formation regions 2A included in one element formation region group Group1 (or Group2) is larger than a parasitic capacitance Cad between two element formation region groups Group1 and Group2.

However, even if the parasitic capacitance Cin is large, there is little risk of fluctuations in threshold voltage and so on, provided that a write operation such as that described in FIGS. 15A-15D is performed. The two element formation regions 2A in one element formation region group Group1 (or Group2) are simultaneously subjected to the write operation, hence, even if inter-cell interference occurs between these two element formation regions 2A, effects of the interference can be absorbed during execution of said write operation. Therefore, there is little risk that width of the threshold voltage distribution spreads unexpectedly or that a mistaken write or the like occurs.

On the other hand, the parasitic capacitance Cad is small, hence, even if for example a write operation in the element formation region group Group2 is started subsequent to a write operation in the element formation region group Group1 being completed, the inter-cell interference effects due to this parasitic capacitance Cad are small, hence adverse influence is suppressed.

In addition, the fact that in this embodiment element formation region groups Group of the above-mentioned kind are formed and a write operation such as in FIGS. 15A-15D is executed results in the GBG state not occurring. Therefore, the risk of mistaken writes occurring is suppressed.

[Second Embodiment]

Figure 17:
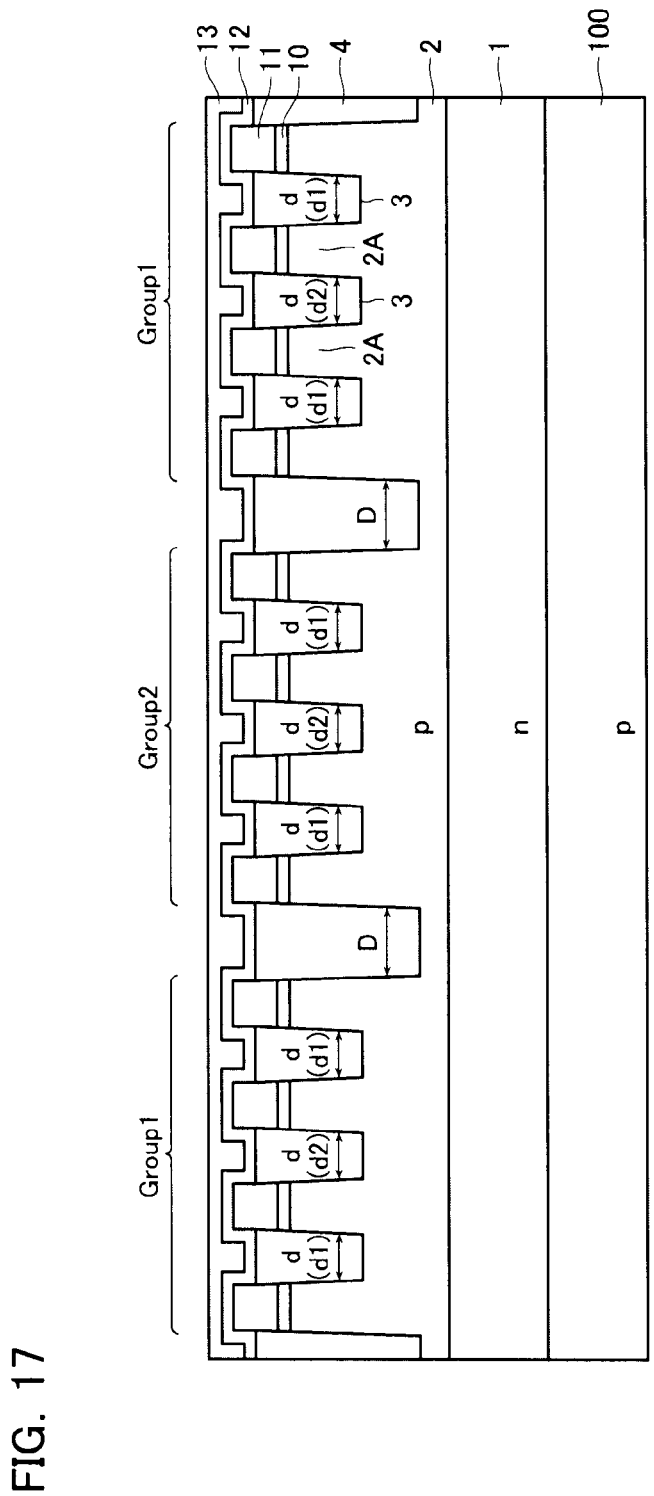
FIG. 17 is a schematic view showing a configuration of a nonvolatile semiconductor memory device according to a second embodiment.

Next, a nonvolatile semiconductor memory device according to a second embodiment is described with reference to FIG. 17. Schematic configuration of the nonvolatile semiconductor memory device in the second embodiment may be almost identical to that in FIGS. 1A-1E, hence a detailed description thereof is omitted.

However, in this second embodiment, one element formation region group Group1 (or Group2) includes four element formation regions 2A. Similarly to in the first embodiment, a spacing between the four element formation regions 2A in one element formation region group is d, and a spacing between two element formation region groups Group is D. However, there may be a difference in the distances d within one element formation region group. For example, it is possible that, of the three spacings, the spacings at both ends are a spacing d1 and only the spacing in the middle is a spacing d2 which is larger than d1. Moreover, the element formation region 2A having such a positional relationship may be formed using a fourfold sidewall transfer process to be described later.

Figure 18A:
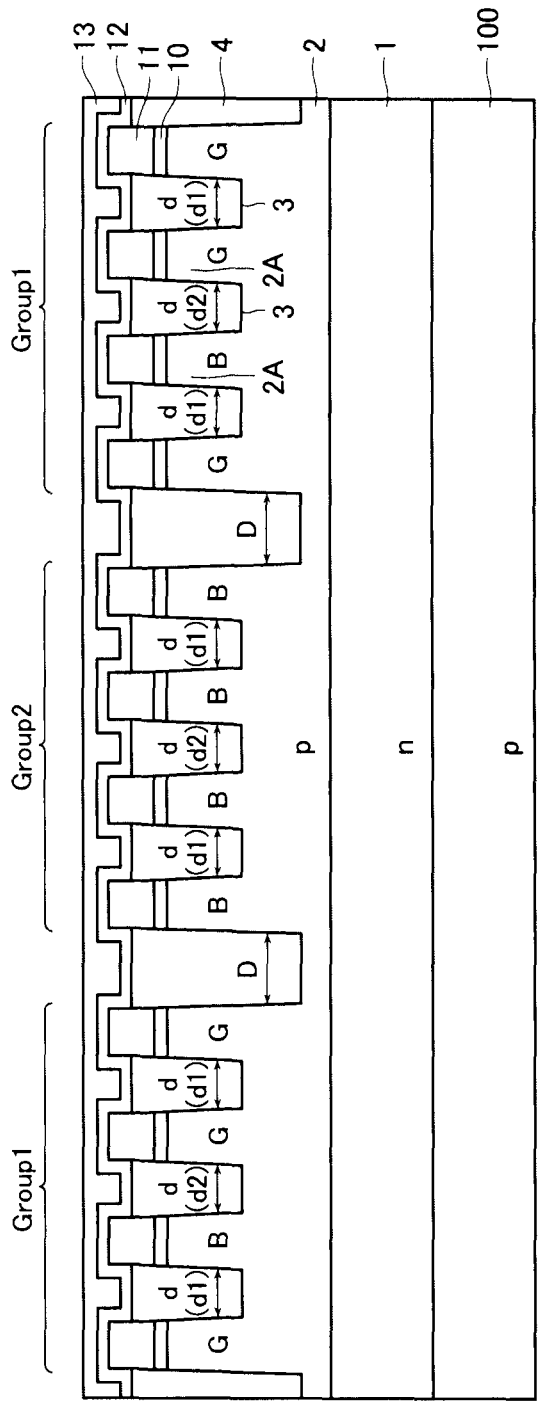
FIG. 18A is a view showing operation of the nonvolatile semiconductor memory device according to the second embodiment.
Figure 18B:
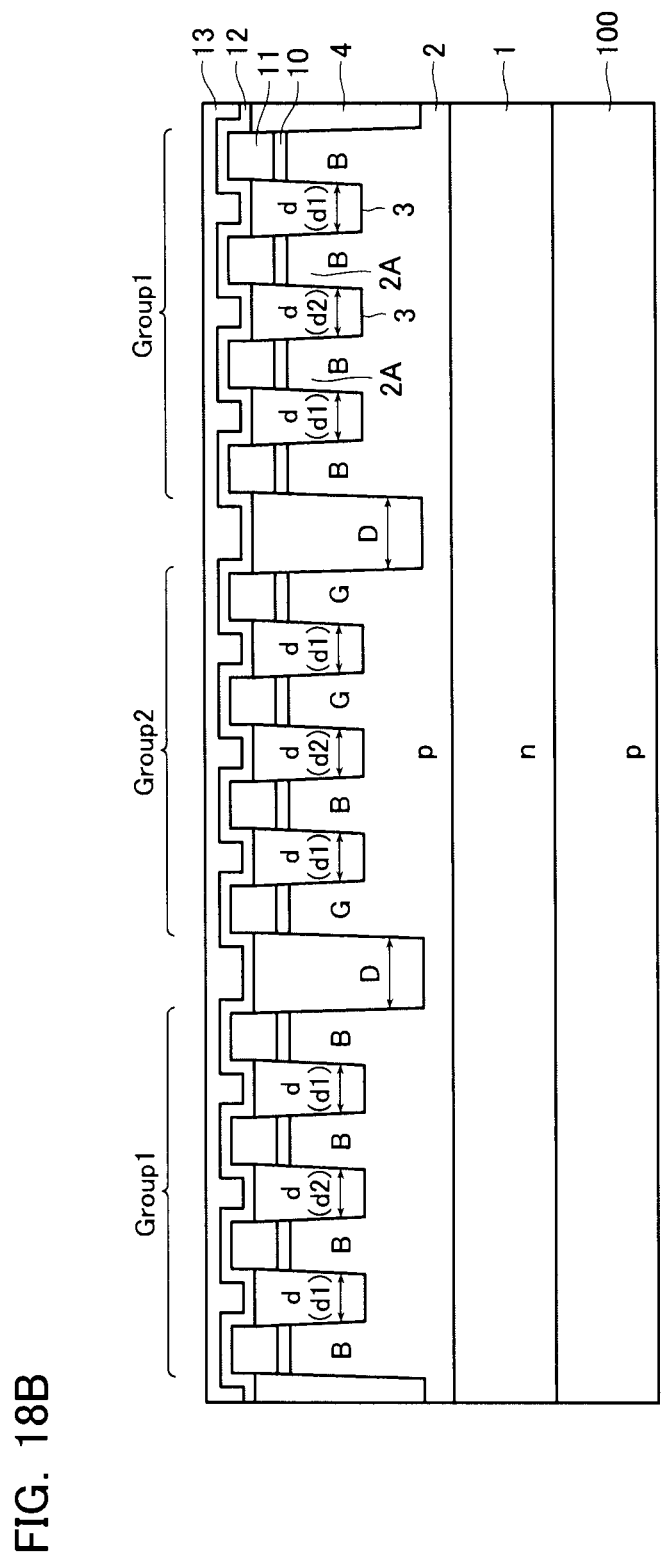
FIG. 18B is a view showing operation of the nonvolatile semiconductor memory device according to the second embodiment.

Next, a write operation in the second embodiment is described with reference to FIGS. 18A and 18B. FIG. 18A shows an operation in the case where the element formation region group Group1 is subjected to the write operation and the element formation region group Group2 is set to write prohibit. FIG. 18B shows an operation in the case where the element formation region group Group2 is subjected to the write operation and the element formation region group Group1 is set to write prohibit. A method of applying voltages to the word lines WL, bit lines BL, source line CELSRC, and select gate lines SGD and SGS is substantially similar to that in the first embodiment (FIGS. 15A and 15B), hence a detailed description thereof is omitted.

As shown in FIG. 18A, in the case where the element formation region group Group1 is subjected to the write operation and the element formation region group Group2 is set to write prohibit, the element formation regions 2A in the element formation region group Group1 are set to either the boost state (B) or ground state (G) according to write data. On the other hand, all the element formation regions 2A in the element formation region group Group2 are set to the boost state (B).

Conversely, as shown in FIG. 18B, in the case where the element formation region group Group2 is subjected to the write operation and the element formation region group Group1 is set to write prohibit, the element formation regions 2A in the element formation region group Group2 are set to either the boost state (B) or ground state (G) according to write data. On the other hand, all the element formation regions 2A in the element formation region group Group1 are set to the boost state (B).

The present embodiment has a distance between element formation region groups Group set large, hence allows similar advantages to those in the first embodiment to be obtained. That is, capacitive coupling Cad between element formation regions at an end of the element formation region group is small, hence, even if for example a write operation in the element formation region group Group2 is started subsequent to a write operation in the element formation region group Group1 being completed, adverse influence is suppressed.

In addition, regarding cells positioned at both ends of each of the element formation region groups Group, it is possible to suppress generation of the GBG state between for example memory cells at a right-hand end of the element formation region group Group1 and memory cells at a left-hand end of the element formation region group Group2.

On the other hand, regarding cells other than those positioned at both ends of each of the element formation region groups Group, the above-mentioned GBG state sometimes occurs, hence a lowering of potential due to capacitive coupling may occur in the element formation region 2A in the boost state (B). As a result, the risk of mistaken write occurring is somewhat raised compared to the first embodiment. However, the GBG pattern does not occur in cells positioned at both ends of each element formation region group similarly to in the first embodiment, hence the probability of the GBG state occurring is lowered compared to in a conventional device.

A manufacturing process for forming the element formation region 2A according to the second embodiment is described with reference to FIGS. 19A-19D. This manufacturing process is a similar sidewall transfer process to that in the first embodiment. However, this manufacturing process differs from the manufacturing process in the first embodiment (which is a twofold sidewall transfer process) in being a fourfold sidewall transfer process in which formation of a sidewall film on a core and removal of said core are repeated twice.

Figure 19A:
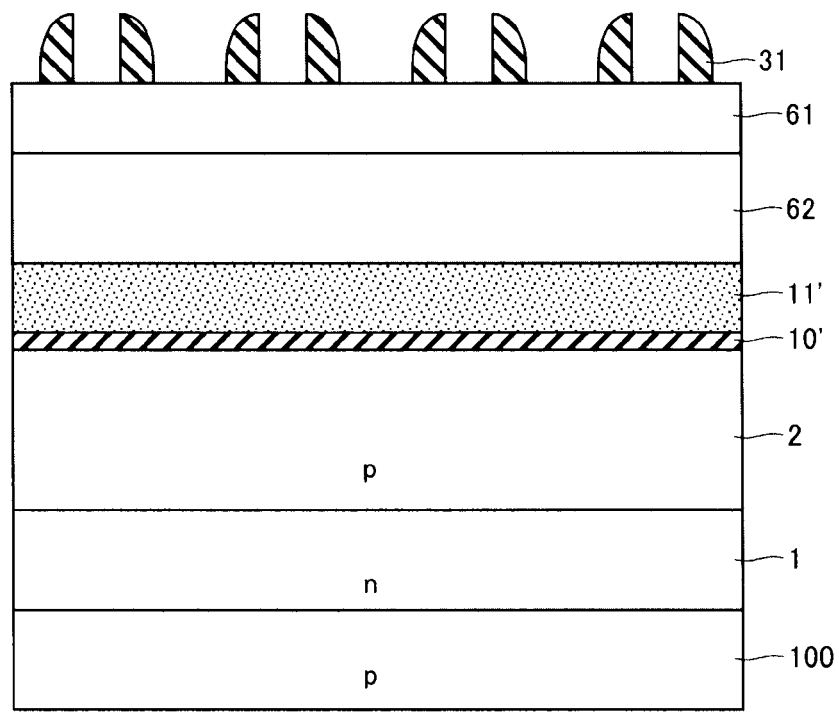
FIG. 19A is a view showing a manufacturing process of the nonvolatile semiconductor memory device according to the second embodiment.
Figure 19B:
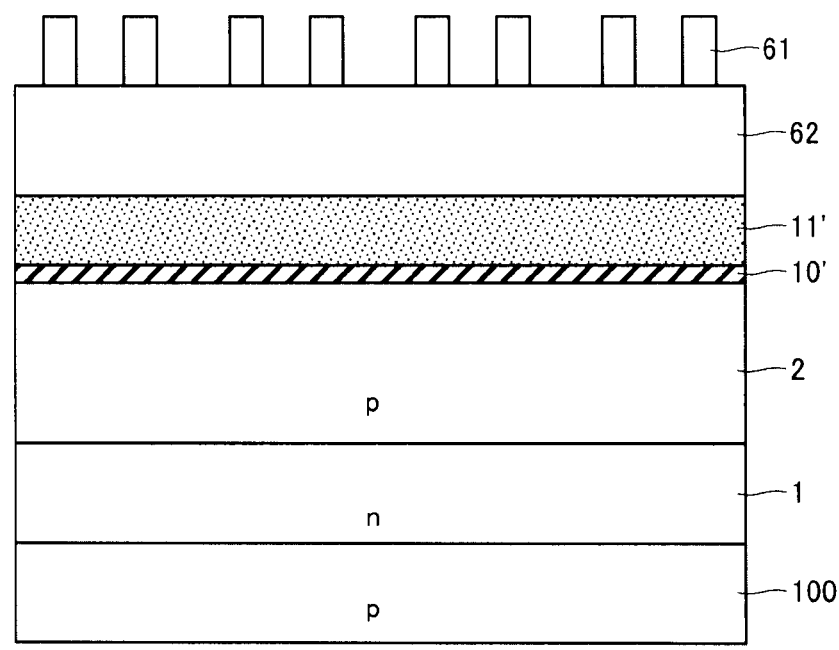
FIG. 19B is a view showing a manufacturing process of the nonvolatile semiconductor memory device according to the second embodiment.
Figure 19C:
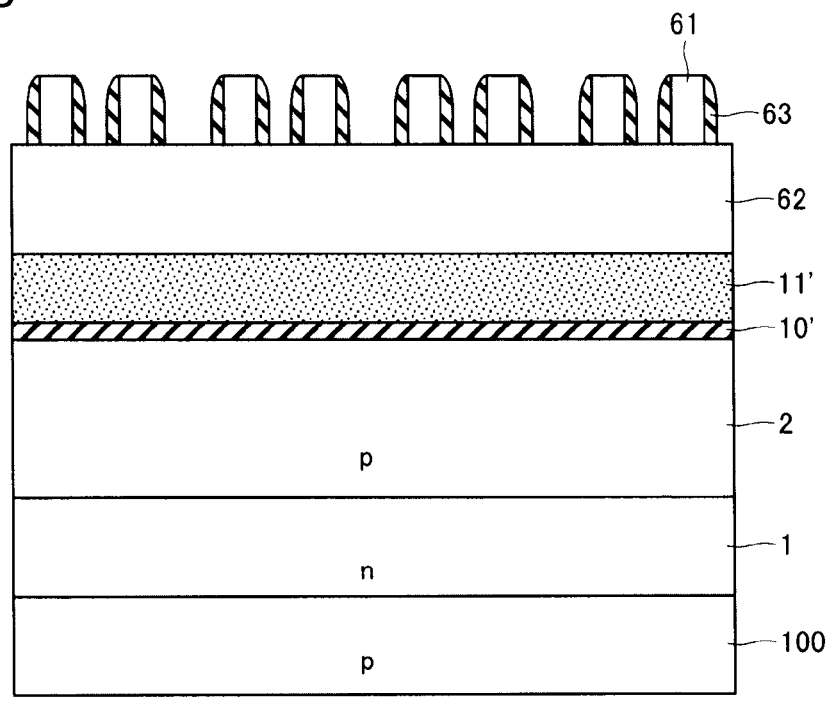
FIG. 19C is a view showing a manufacturing process of the nonvolatile semiconductor memory device according to the second embodiment.
Figure 19D:
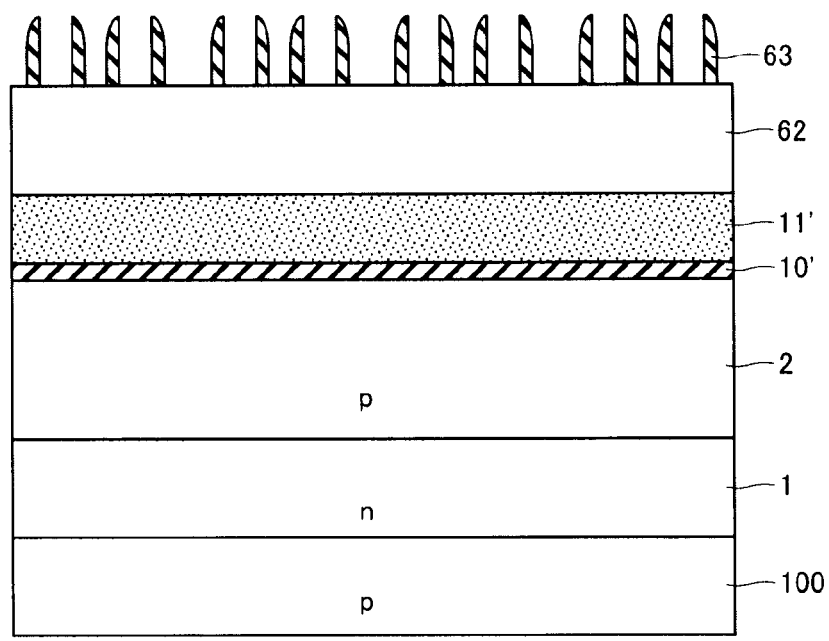
FIG. 19D is a view showing a manufacturing process of the nonvolatile semiconductor memory device according to the second embodiment.

After performing similar processes to those in FIGS. 8-13 (however, in comparison to FIGS. 8-13, hard masks 61 and 62 are added), the remaining sidewall film 31 is used as a mask to perform etching of the hard mask 61, as shown in FIGS. 19A and 19B. Then, after forming a sidewall film 63 on a sidewall of this hard mask 61, the hard mask 61 is removed by wet etching. This sidewall film 63 has a line width of approximately a quarter (¼) of that of the minimum processing dimension F. This sidewall film 63 is used to perform etching of the hard mask 62. Moreover, anisotropic etching using this hard mask 62 as a mask is employed to perform etching of a material film in a layer below the hard mask 62. Executing such anisotropic etching using the sidewall film 63 as a mask allows a trench 3 to be formed with an even smaller width and pitch than in the first embodiment. Adjusting a thickness of the sidewall film 31 and the sidewall film 63 at this time allows spacings d1, d2, and D between element formation regions to be controlled to a desired value.

[Third Embodiment]

Next, a nonvolatile semiconductor memory device according to a third embodiment is described with reference to FIG. 20. Schematic configuration of the nonvolatile semiconductor memory device in the third embodiment may be almost identical to that in FIGS. 1A-1E, hence a detailed description thereof is omitted.

In this third embodiment, the element formation region 2A is formed using the fourfold sidewall transfer process similarly to in the second embodiment. However, in this embodiment, the number of element formation regions 2A included in one element formation region group Group is set to two, similarly to in the first embodiment. This allows the GBG state that occurred in the second embodiment to be prevented from occurring.

Figure 20:
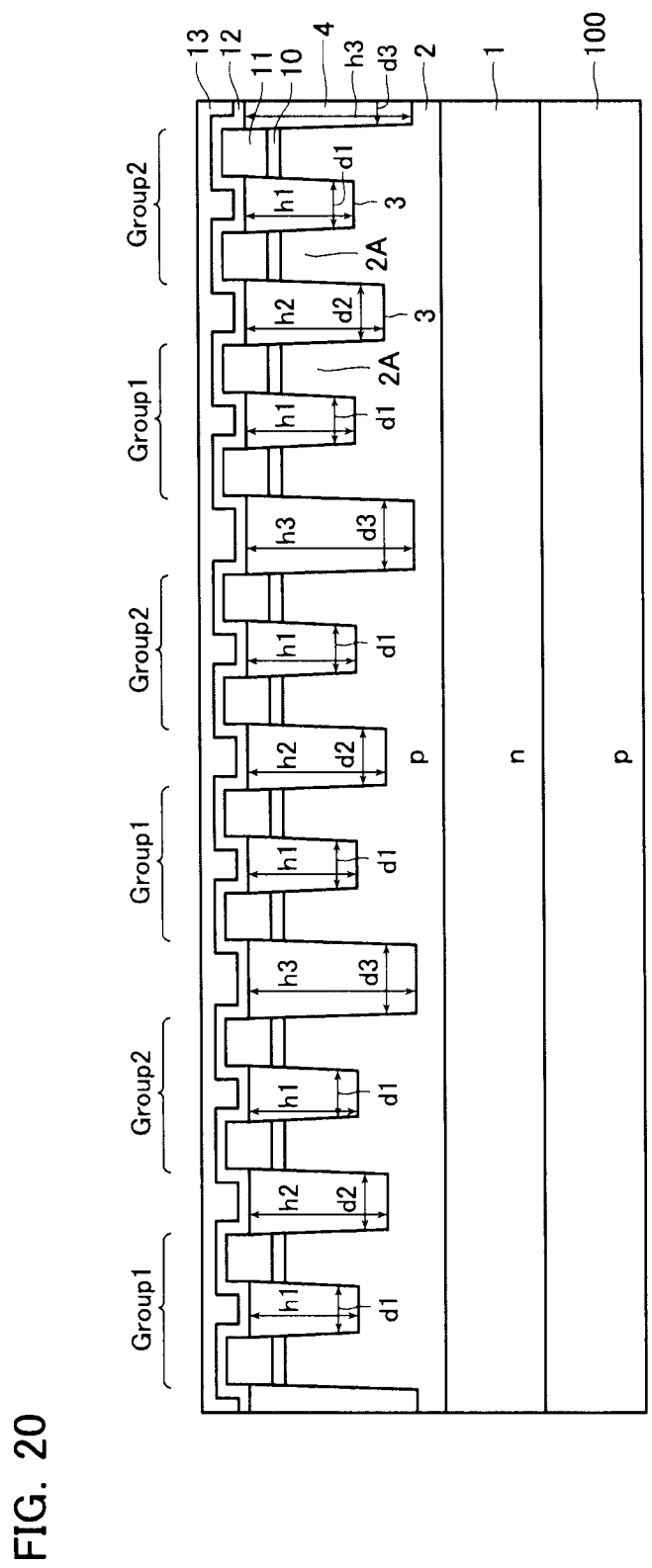
FIG. 20 is a schematic view showing a configuration of a nonvolatile semiconductor memory device according to a third embodiment.

As shown in FIG. 20, when the fourfold sidewall transfer process is employed, trenches 3 of three kinds of widths d1, d2, and d3 are formed (d1<d2<d3; however, d1, d2, and d3 each have values that vary around certain values).

In this case, one element formation region group Group is defined as a group of element formation regions 2A disposed with a smallest spacing d1. Having the element formation region group defined in this way allows similar advantages to those in the first embodiment to be obtained. A method of applying voltages during a write operation may be similar to that in the first embodiment.

Figure 21:
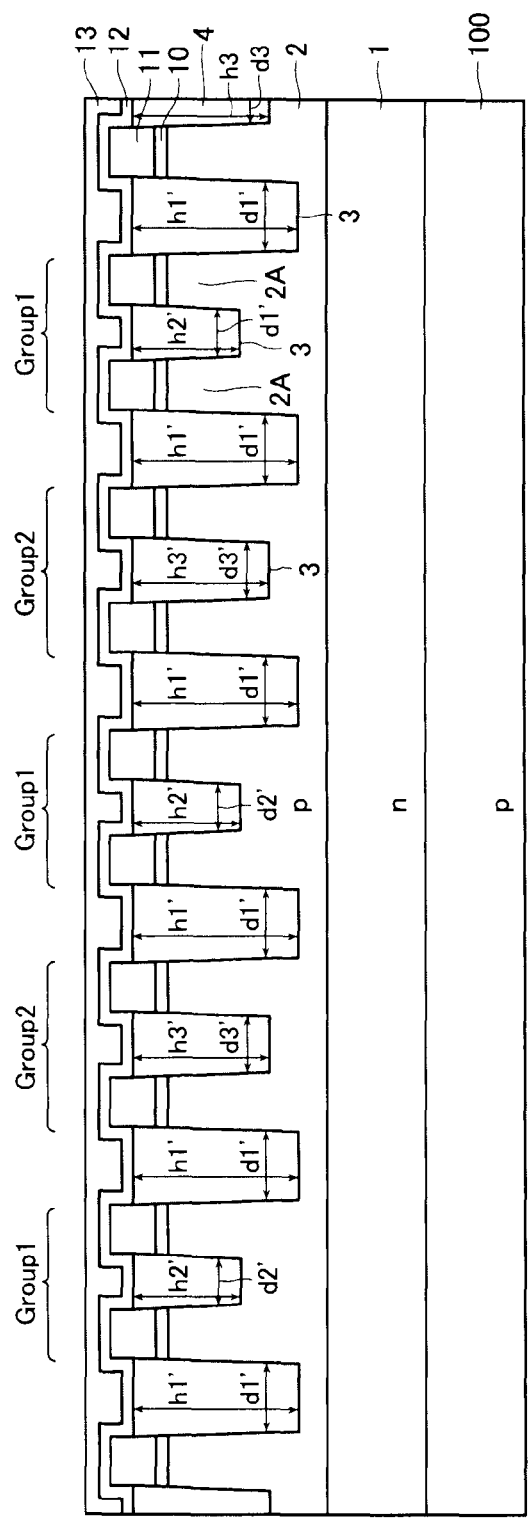
FIG. 21 is a schematic view showing the configuration of the nonvolatile semiconductor memory device according to the third embodiment.

FIG. 21 is a separate example of an element formation region 2A obtained by a fourfold sidewall transfer process. Three kinds of values d1', d2', and d3' are employed as spacings between the element formation regions, the relationship between these values being expressed by d2', d3'<d1'. In this case, one element formation region group is defined as a group of element formation regions 2A disposed with smallest spacings d2' and d3'.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

Figure 22A:
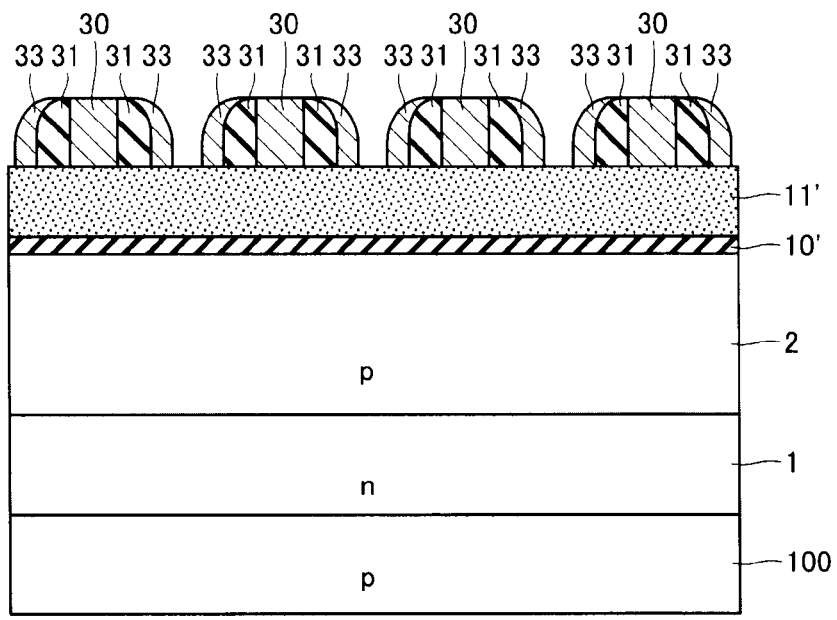
FIG. 22A is a view showing a modified example of the embodiments.
Figure 22B:
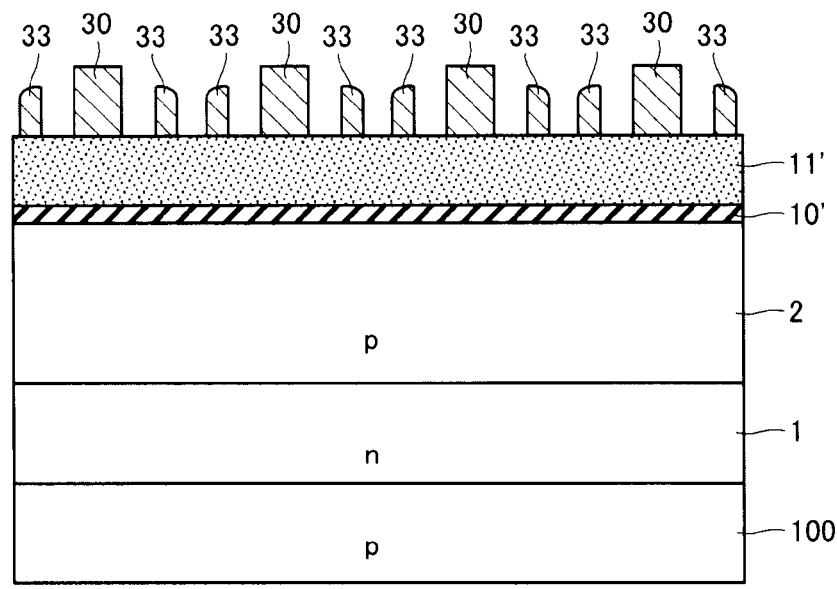
FIG. 22B is a view showing the modified example of the embodiments.

For example, the above-described embodiments show examples where the element formation region 2A is formed by the twofold sidewall transfer process or the fourfold transfer process. However, the present embodiment may be applied generally to the case where a sidewall transfer process is employed to form the element formation region 2A with a dimension of not more than the minimum processing dimension. For example, the present invention is applicable also to an element formation region 2A formed by a sidewall transfer process of the kind shown in FIGS. 22A and 22B. That is, after performing the processes in FIGS. 8-12, a sidewall film 33 is further formed on an outer side of the sidewall film 31 from a material identical to that of the first hard mask 30. Moreover, only the sidewall film 31 is removed by wet etching, while leaving the sidewall film 33 and the first hard mask 30. An etching may be performed using the this sidewall film 33 and the first hard mask 30 as a mask. An element formation region 2A formed by such a sidewall transfer process may also define an element formation region group, and a write operation may also be performed on the basis of this element formation region group, similarly to in the aforementioned embodiments.

What is claimed is:

1. A nonvolatile semiconductor memory device, comprising:
a semiconductor substrate having a memory cell array and a control circuit;
a plurality of element isolation insulating films formed in the semiconductor substrate in the memory cell array and having a first direction as a long direction;
a plurality of element formation regions which are formed isolated by the element isolation insulating films and in each of which a memory string is formed; and
a plurality of element formation region groups each configured by the element formation regions, the plurality of element formation region groups being arranged along a second direction orthogonal to the first direction;
wherein
in the memory cell array, in the second direction, a spacing between the element formation regions changes periodically, and a spacing between the element formation region groups is larger than a spacing between the element formation regions in each of the element formation region groups, and
the control circuit executes a write operation on the memory cell array on an element formation region group basis.

2. The nonvolatile semiconductor memory device according to claim 1, wherein
a depth of the element isolation insulating film sandwiched by two of the element formation region groups is larger than a depth of the element isolation insulating film sandwiched by the element formation regions in each of the element formation region groups.

3. The nonvolatile semiconductor memory device according to claim 2, wherein
the spacing between the element formation region groups is larger than the spacing between the element formation regions in each of the element formation region groups by 10% or more.

4. The nonvolatile semiconductor memory device according to claim 1, wherein
the control circuit is configured to execute separately the write operation on the element formation region groups located in odd-numbered positions as viewed from the second direction and the write operation on the element formation region groups located in even-numbered positions as viewed from the second direction.

5. The nonvolatile semiconductor memory device according to claim 4, wherein
in the element formation region group where the write operation is to be executed, the control circuit applies a first voltage or a second voltage to the bit lines connected to the memory strings, according to a kind of data to be written, and
in the element formation region group where the write operation is to be prohibited, the control circuit applies the second voltage fixedly to all of the bit lines connected to the memory strings.

6. The nonvolatile semiconductor memory device according to claim 4, wherein
the spacing between the element formation region groups is larger than the spacing between the element formation regions in each of the element formation region groups by 10% or more.

7. The nonvolatile semiconductor memory device according to claim 1, wherein
a depth of the element isolation insulating film sandwiched by two of the element formation region groups is larger than a depth of the element isolation insulating film sandwiched by the element formation regions in the element formation region groups.

8. The nonvolatile semiconductor memory device according to claim 7, wherein
the spacing between the element formation region groups is larger than the spacing between the element formation regions in each of the element formation region groups by 10% or more.

9. The nonvolatile semiconductor memory device according to claim 7, wherein
the control circuit is configured to execute separately the write operation on the element formation region groups located in odd-numbered positions as viewed from the second direction and the write operation on the element formation region groups located in even-numbered positions as viewed from the second direction.

10. The nonvolatile semiconductor memory device according to claim 9, wherein
the spacing between the element formation region groups is larger than the spacing between the element formation regions in each of the element formation region groups by 10% or more.

11. The nonvolatile semiconductor memory device according to claim 1, wherein the control circuit is configured to execute separately the write operation on the element formation region groups located in odd-numbered positions as viewed from the second direction and the write operation on the element formation region groups located in even-numbered positions as viewed from the second direction.

12. The nonvolatile semiconductor memory device according to claim 11, wherein
the spacing between the element formation region groups is larger than the spacing between the element formation regions in each of the element formation region groups by 10% or more.

13. The nonvolatile semiconductor memory device according to claim 1, wherein
the control circuit performs a voltage application operation so as to, while executing one of a first write operation on the element formation region groups located in odd-numbered positions as viewed from the second direction and a second write operation on the element formation regions groups located in even-numbered positions as viewed from the second direction, prohibit the other of the first write operation and the second write operation.

14. The nonvolatile semiconductor memory device according to claim 13, wherein
in the element formation region group where the write operation is to be executed, the control circuit applies a first voltage or a second voltage to the bit lines connected to the memory strings, according to a kind of data to be written, and
in the element formation region group where the write operation is to be prohibited, the control circuit applies the second voltage fixedly to all of the bit lines connected to the memory strings.

15. The nonvolatile semiconductor memory device according to claim 13, wherein
a depth of the element isolation insulating film sandwiched by two of the element formation region groups is larger than a depth of the element isolation insulating film sandwiched by the element formation regions in each of the element formation region groups.

16. The nonvolatile semiconductor memory device according to claim 13, wherein
the spacing between the element formation regions changes periodically.

17. The nonvolatile semiconductor memory device according to claim 1, wherein
the spacing between the element formation region groups is larger than the spacing between the element formation regions in each of the element formation region groups by 10% or more.

18. A method of write in a nonvolatile semiconductor memory device,
the nonvolatile semiconductor memory device including:
a semiconductor substrate;
a plurality of element isolation insulating films formed in the semiconductor substrate and having a first direction as a long direction;
a plurality of element formation regions which are formed isolated by the element isolation insulating films and in each of which a memory string is formed; and
a plurality of element formation region groups each configured by a plurality of the element formation regions, the plurality of element formation region groups being arranged along the second direction orthogonal to the first direction;
wherein
in the second direction, a spacing between the element formation regions changing periodically, and a spacing between the element formation region groups is larger than a spacing between the element formation regions in the element formation region groups,
the method of write comprising:
while executing a write operation on the element formation region groups located in odd-numbered positions as viewed from the second direction, prohibiting the write operation on the element formation regions groups located in even-numbered positions as viewed from the second direction, and
while executing the write operation on the element formation region groups located in the even-numbered positions as viewed from the second direction, prohibiting the write operation on the element formation regions groups located in the odd-numbered positions as viewed from the second direction.

19. The method of write according to claim 18, further comprising:
in the element formation region group where the write operation is to be executed, applying a first voltage or a second voltage to the bit lines connected to the memory strings, according to a kind of data to be written, and
in the element formation region group where the write operation is to be prohibited, applying the second voltage fixedly to all of the bit lines connected to the memory strings.

* * * * *